(12) United States Patent
Shih

(10) Patent No.: US 11,502,025 B2
(45) Date of Patent: Nov. 15, 2022

(54) SEMICONDUCTOR DEVICE WITH ETCH STOP LAYER HAVING GREATER THICKNESS AND METHOD FOR FABRICATING THE SAME

(71) Applicant: NANYA TECHNOLOGY CORPORATION, New Taipei (TW)

(72) Inventor: Shing-Yih Shih, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 46 days.

(21) Appl. No.: 17/087,073

(22) Filed: Nov. 2, 2020

(65) Prior Publication Data

US 2022/0139805 A1 May 5, 2022

(51) Int. Cl.
*H01L 21/02* (2006.01)
*H01L 23/48* (2006.01)
*H01L 23/00* (2006.01)
*H01L 21/768* (2006.01)

(52) U.S. Cl.
CPC ...... *H01L 23/481* (2013.01); *H01L 21/76898* (2013.01); *H01L 24/32* (2013.01); *H01L 24/83* (2013.01); *H01L 2224/32145* (2013.01); *H01L 2224/83896* (2013.01)

(58) Field of Classification Search
CPC ............ H01L 21/022; H01L 23/481; H01L 21/76898; H01L 24/32; H01L 24/83; H01L 2224/32145
See application file for complete search history.

(56) References Cited

U.S. PATENT DOCUMENTS 11,094,714 B2 * 8/2021 Chen ............... H01L 21/76877

\* cited by examiner

*Primary Examiner* — Mohammad M Choudhry
(74) *Attorney, Agent, or Firm* — Muncy, Geissler, Olds & Lowe, P.C.

(57) ABSTRACT

The present application discloses a semiconductor device with an etch stop layer having greater thickness and a method for fabricating the semiconductor device. The semiconductor device includes a first semiconductor die including a first conductive layer, a first etch stop layer positioned on the first conductive layer, a second semiconductor die including a second conductive layer positioned above the first etch stop layer, a second etch stop layer positioned on the second conductive layer, a first through substrate via positioned along the second semiconductor die and the first etch stop layer, extended to the first semiconductor die, and positioned on the first conductive layer, and a second through substrate via extended to the second semiconductor die, positioned along the second etch stop layer, and positioned on the second conductive layer. A thickness of the second etch stop layer is greater than a thickness of the first etch stop layer.

13 Claims, 27 Drawing Sheets

SEMICONDUCTOR DEVICE WITH ETCH STOP LAYER HAVING GREATER THICKNESS AND METHOD FOR FABRICATING THE SAME

TECHNICAL FIELD

The present disclosure relates to a semiconductor device and a method for fabricating the semiconductor device, and more particularly, to a semiconductor device with an etch stop layer having greater thickness and a method for fabricating the semiconductor device with the etch stop layer having greater thickness.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the increasing demand of computing ability. However, a variety of issues arise during the scaling-down process, and such issues are continuously increasing. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device including a first semiconductor die including a first conductive layer, a first etch stop layer positioned on the first conductive layer, a second semiconductor die including a second conductive layer positioned above the first etch stop layer, a second etch stop layer positioned on the second conductive layer, a first through substrate via positioned along the second semiconductor die and the first etch stop layer, extended to the first semiconductor die, and positioned on the first conductive layer, and a second through substrate via extended to the second semiconductor die, positioned along the second etch stop layer, and positioned on the second conductive layer. A thickness of the second etch stop layer is greater than a thickness of the first etch stop layer.

In some embodiments, the first etch stop layer and the second etch stop layer are formed of a same material.

In some embodiments, a ratio of the thickness of the second etch stop layer to the thickness of the first etch stop layer is between about 1.1 and about 2.0.

In some embodiments, a width of the second through substrate via is equal to or greater than a width of the first through substrate via.

In some embodiments, the semiconductor device includes a top conductive layer positioned on the first through substrate via and the second through substrate via.

In some embodiments, the semiconductor device includes isolation layers positioned on sidewalls of the first through substrate via. The isolation layers are formed of silicon oxide, silicon nitride, silicon oxynitride, tetra-ethyl orthosilicate, or combination thereof.

In some embodiments, the semiconductor device includes an adhesion layer positioned between the first conductive layer and the first through substrate via. The adhesion layer is formed of titanium, tantalum, titanium tungsten, or manganese nitride.

In some embodiments, the semiconductor device includes a seed layer positioned between the first conductive layer and the first through substrate via. The seed layer is formed of copper or ruthenium.

In some embodiments, the semiconductor device includes a first bonding layer positioned on the first etch stop layer and positioned between the first semiconductor die and the second semiconductor die.

In some embodiments, an aspect ratio of the second through substrate via is between about between about 1:6 and about 1:15.

In some embodiments, the second semiconductor die includes a second dielectric layer positioned on the first bonding layer and a second substrate positioned on the second dielectric layer. The second conductive layer and the second etch stop layer are positioned in the second dielectric layer. The second through substrate via is positioned along the second substrate, extended to the second dielectric layer, positioned along the second etch stop layer, and positioned on the second conductive layer.

In some embodiments, the second dielectric layer is formed of silicon oxide and the first etch stop layer and the second etch stop layer are formed of silicon nitride, silicon oxynitride, or silicon carbonitride.

In some embodiments, the seed layer has a thickness between about 10 nm and about 40 nm.

Another aspect of the present disclosure provides a method for fabricating a semiconductor device including providing a first semiconductor die including a first conductive layer, forming a first etch stop layer on the first conductive layer, bonding a second semiconductor die, which includes a second conductive layer above the first etch stop layer and a second etch stop layer on the second conductive layer, onto the first etch stop layer, performing a via etch process to concurrently form a first via opening to expose the first etch stop layer and a second via opening to expose the second etch stop layer, conformally forming isolation layers in the first via opening and the second via opening, performing a punch etch process to extend the first via opening and the second via opening by removing the isolation layers formed on the first via opening and the second via opening, the first etch stop layer formed on the first conductive layer, and the second etch stop layer formed on the second conductive layer, and concurrently forming a first through substrate via in the first via opening and a second through substrate via in the second via opening. The second etch stop layer has a greater thickness than that of the first etch stop layer.

In some embodiments, the first etch stop layer and the second etch stop layer are formed of a same material.

In some embodiments, the first etch stop layer and the second etch stop layer are formed of silicon nitride, silicon oxynitride, or silicon carbonitride.

In some embodiments, the via etch process uses an etchant comprising perfluoroisobutylene or hexafluorobutadiene.

In some embodiments, the punch etch process includes tetrafluoromethane.

Another aspect of the present disclosure provides a method for fabricating a semiconductor device including providing a first semiconductor die including a first conductive layer, forming a first etch stop layer on the first conductive layer, bonding a second semiconductor die, which includes a second conductive layer above the first etch stop layer and a second etch stop layer on the second conductive layer, onto the first etch stop layer, performing a via etch process to form a first via opening to expose the first etch stop layer and a second via opening to expose the second etch stop layer 303, conformally forming isolation layers in the first via opening and the second via opening, performing a punch etch process to extend the first via opening and the second via opening by removing the isolation layers formed on the first via opening and the second via opening, the first etch stop layer formed on the first conductive layer, and the second etch stop layer formed on the second conductive layer, and integrally forming a first through substrate via in the first via opening and a second through substrate via in the second via opening. The first etch stop layer is formed of a material having etch selectivity to the second etch stop layer.

In some embodiments, the via etch process has an etch rate ratio of the first etch stop layer to the second etch stop layer between about 1:05:1 and about 25:1.

Due to the design of the semiconductor device of the present disclosure, the greater thickness of the second etch stop layer may compensate the adverse effect of over etching during formation of the via openings. As a result, the yield/reliability of the semiconductor device may be improved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
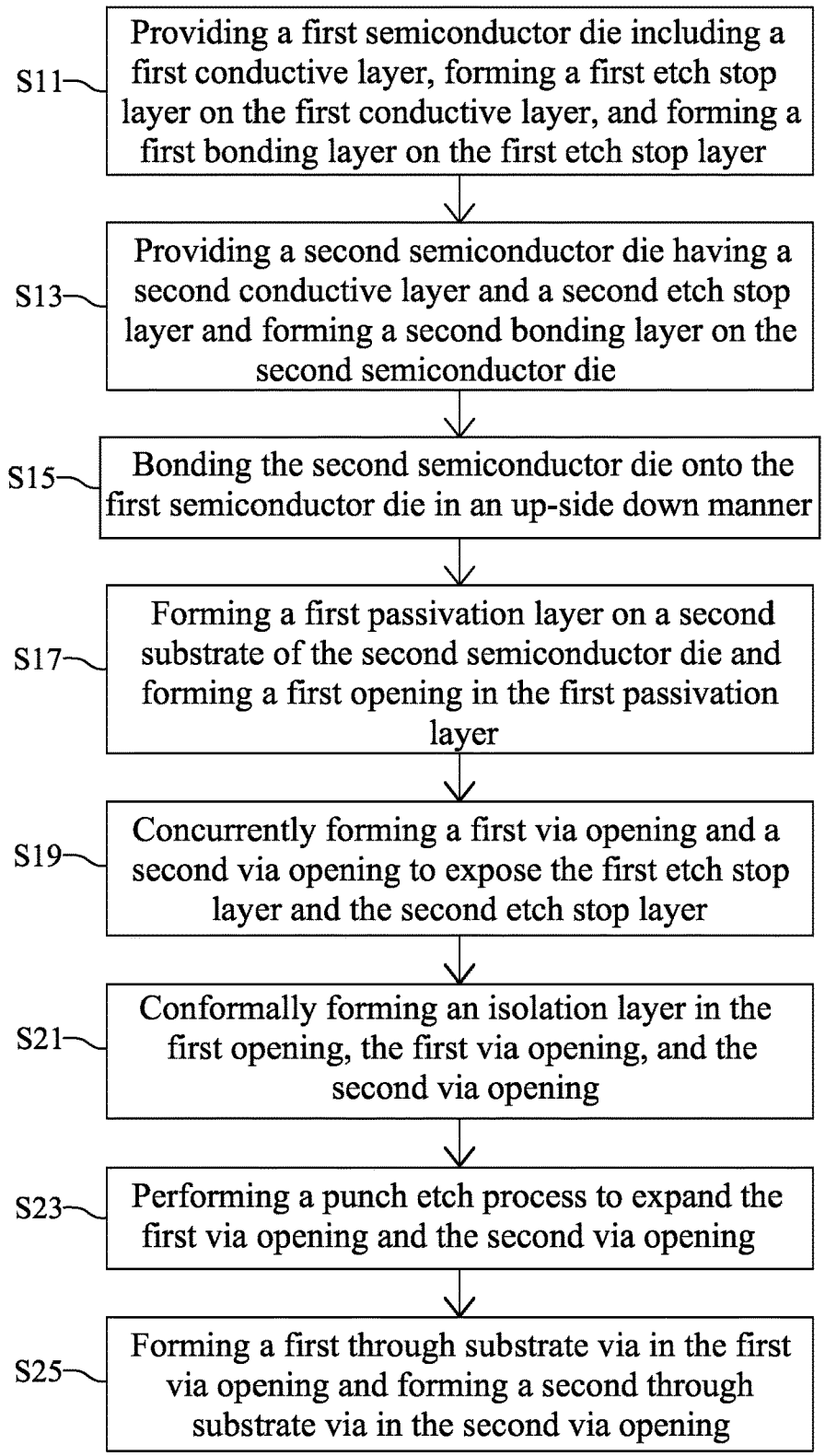
FIG. 1 illustrates, in a flowchart diagram form, a method for fabricating a semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

It should be noted that, in the description of the present disclosure, above (or up) corresponds to the direction of the arrow of the direction Z, and below (or down) corresponds to the opposite direction of the arrow of the direction Z.

FIG. 1 illustrates, in a flowchart diagram form, a method 10 for fabricating a semiconductor device 1A in accordance with one embodiment of the present disclosure. FIGS. 2 to 15 illustrate, in schematic cross-sectional view diagrams, a flow for fabricating the semiconductor device 1A in accordance with one embodiment of the present disclosure.

Figure 2:
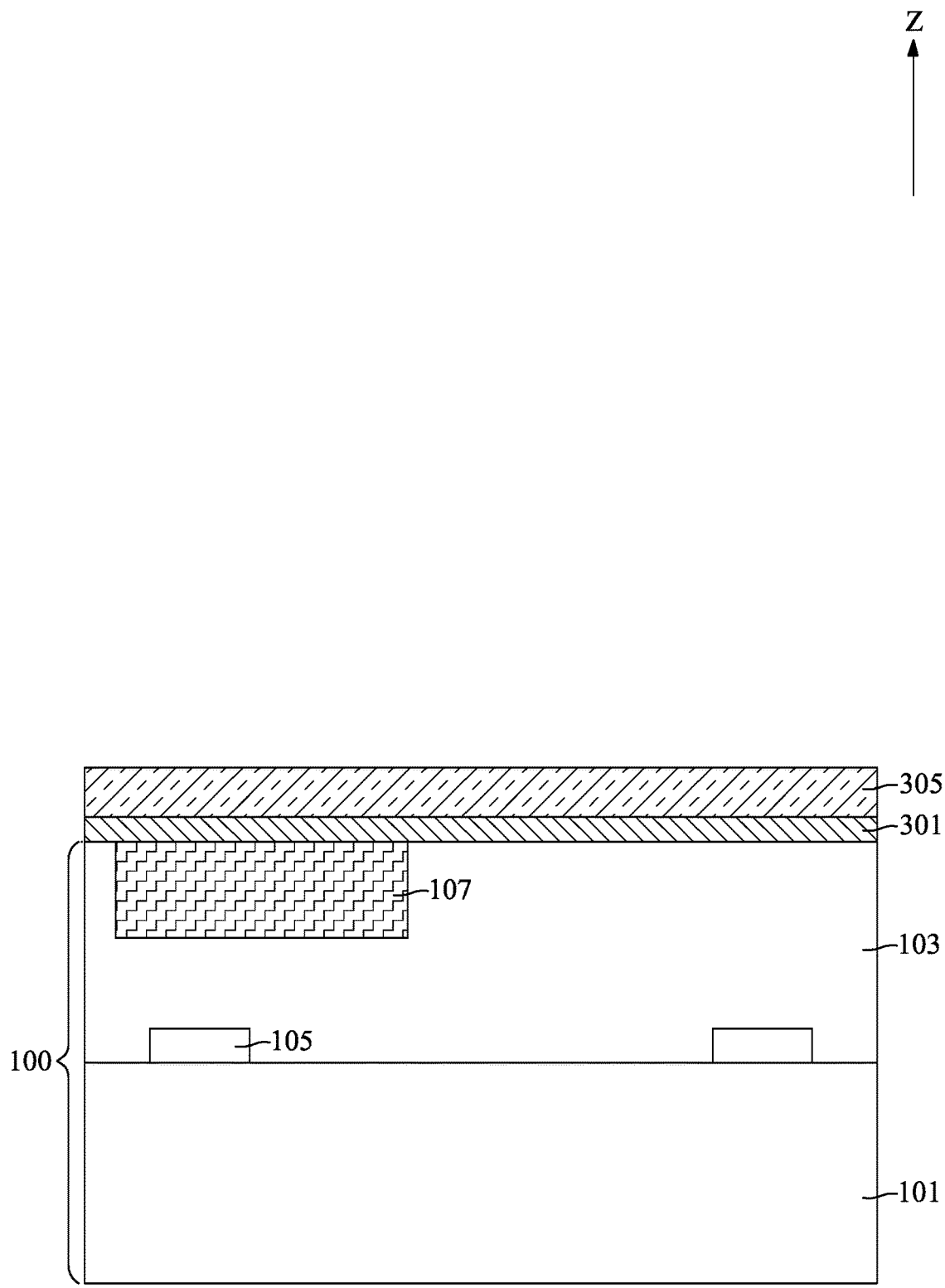
FIGS. 2 to 15 illustrate, in schematic cross-sectional view diagrams, a flow for fabricating the semiconductor device in accordance with one embodiment of the present disclosure.

With reference to FIGS. 1 and 2, at step S11, a first semiconductor die 100 including a first conductive layer 107 may be provided, a first etch stop layer 301 may be formed on the first conductive layer 107, and a first bonding layer 305 may be formed on the first etch stop layer 301.

With reference to FIG. 2, the first semiconductor die 100 may include a first substrate 101, a first dielectric layer 103, first devices 105 (only shown two for clarity), and the first conductive layer 107.

The first substrate 101 may be formed of, for example, silicon, germanium, silicon germanium, silicon carbon, silicon germanium carbon, gallium, gallium arsenide, indium arsenide, indium phosphorus or other IV-IV, III-V or II-VT semiconductor materials. In some embodiments, the substrate 101 may include an organic semiconductor or a layered semiconductor such as silicon/silicon germanium, silicon-on-insulator, or silicon germanium-on-insulator. When the substrate 101 is formed of silicon-on-insulator, the substrate 101 may include a top semiconductor layer and a bottom semiconductor layer formed of silicon, and a buried insulating layer which may separate the top semiconductor layer from the bottom semiconductor layer. The buried insulating layer may include, for example, a crystalline or non-crystalline oxide, nitride, or any combination thereof.

With reference to FIG. 2, the first dielectric layer 103 may be formed on the first substrate 101. In some embodiments, the first dielectric layer 103 may be a stacked layer structure. The first dielectric layer 103 may include a plurality of first insulating sub-layers. Each of the plurality of first insulating sub-layers may have a thickness between about 0.5 μm and about 3.0 μm. The plurality of first insulating sub-layers may be formed of, for example, silicon oxide, borophosphosilicate glass, undoped silicate glass, fluorinated silicate glass, low-k dielectric materials, the like, or a combination thereof. The plurality of first insulating sub-layers may be formed of different materials but are not limited thereto. The low-k dielectric materials may have a dielectric constant less than 3.0 or even less than 2.5. In some embodiments, the low-k dielectric materials may have a dielectric constant less than 2.0. In the embodiment depicted, the first dielectric layer 103 is formed of silicon oxide.

The first dielectric layer 103 may be formed by deposition processes such as chemical vapor deposition, plasma-enhanced chemical vapor deposition, evaporation, or spin-on coating. Planarization processes may be respectively correspondingly performed after the deposition processes to remove excess material and provide a substantially flat surface for subsequent processing steps. The first devices 105 and the first conductive layer 107 may be formed during the formation of the first dielectric layer 103.

With reference to FIG. 2, the first devices 105 may be formed in a lower portion of the first dielectric layer 103. In some embodiments, the first devices 105 may be formed on the first substrate 101. The first devices 105 may be, for example, bipolar junction transistors, metal-oxide-semiconductor field-effect transistors, diodes, flash memories, dynamic random-access memories, static random-access memories, electrically erasable programmable read-only memories, image sensors, micro-electro-mechanical systems, active devices, or passive devices.

With reference to FIG. 2, the first conductive layer 107 may be formed in the upper portion of the first dielectric layer 103. In the embodiment depicted, the top surface of the first conductive layer 107 may be substantially coplanar with the top surface of the first dielectric layer 103. The first conductive layer 107 may be a pad layer of the first semiconductor die 100. The first conductive layer 107 may be formed of, for example, aluminum, copper, aluminum-copper alloy, aluminum alloy, copper alloy, or other suitable conductive materials. The first conductive layer 107 may be formed by a deposition process such as chemical vapor deposition, physical vapor deposition, evaporation, or sputtering and subsequent photo-etch process defining the pattern of the first conductive layer 107.

With reference to FIG. 2, the first etch stop layer 301 may be formed on the first conductive layer 107 and the first dielectric layer 103. The first etch stop layer 301 may be formed by chemical vapor deposition, plasma-enhanced chemical vapor deposition, or the like.

With reference to FIG. 2, the first bonding layer 305 may be formed on the first etch stop layer 301. In some embodiments, the first bonding layer 305 may be formed of, for example, a non-organic material selected from un-doped silicate glass, silicon nitride, silicon oxynitride, silicon oxide, silicon nitride oxide, and combinations thereof. In some embodiments, the first bonding layer 305 may be formed of, for example, a polymer layer such as an epoxy, polyimide, benzocyclobutene, polybenzoxazole, or the like. The first bonding layer 305 may be formed by a deposition process such as chemical vapor deposition, plasma-enhanced chemical vapor deposition, evaporation, or spin-on coating. In some embodiments, dummy conductive layers (not shown for clarity) may be formed in the first bonding layer 305. The top surfaces of the dummy conductive layers may be substantially coplanar with the top surface of the first bonding layer 305.

The dummy conductive layers may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or combinations thereof.

It should be noted that, in the description of the present disclosure, referring to an element as a "dummy" element means that no exterior voltage or current is applied to the element when the semiconductor device 1A is in operation.

Figure 3:
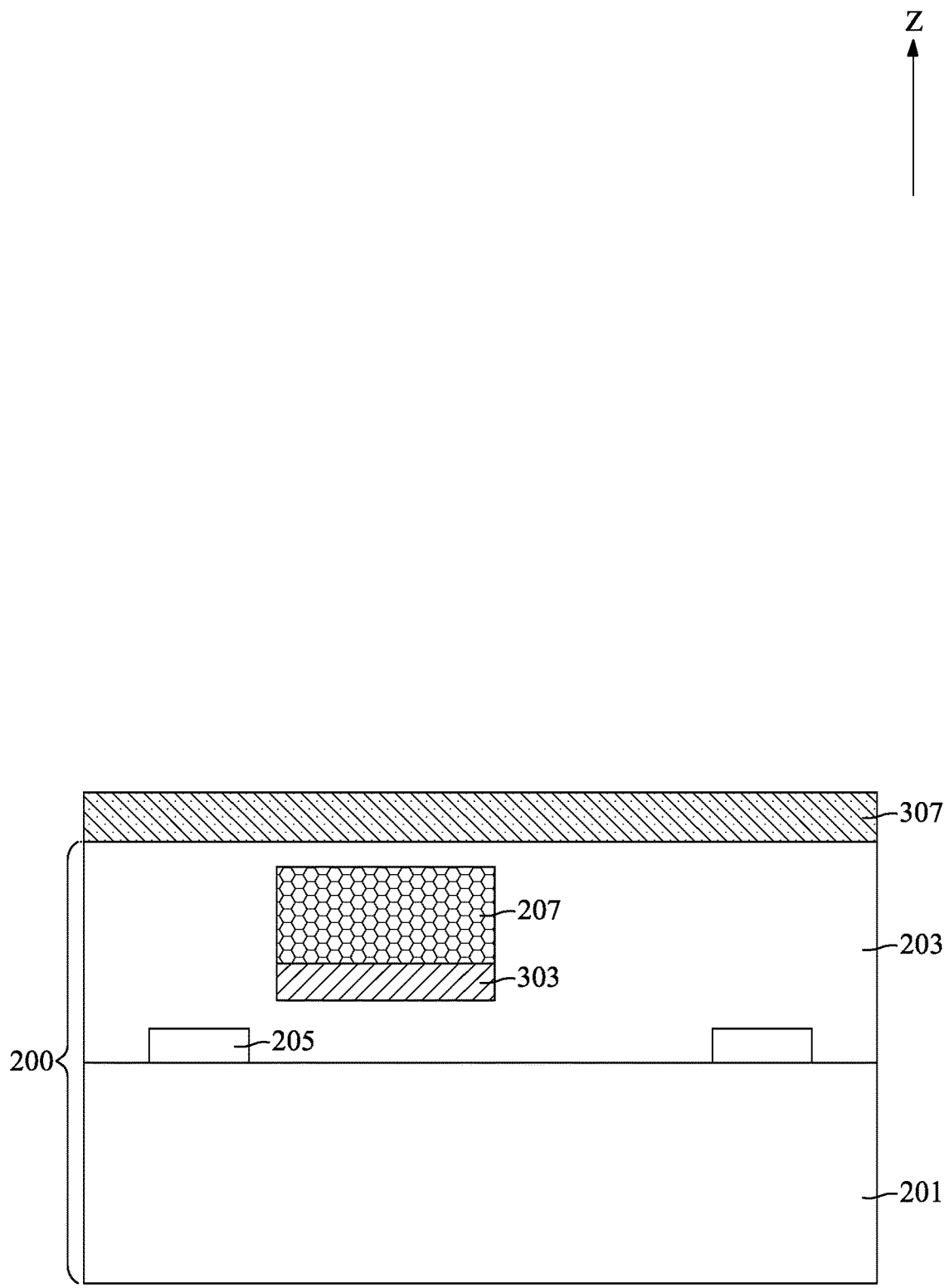

With reference to FIGS. 1 and 3, at step S13, a second semiconductor die 200 having a second conductive layer 207 and a second etch stop layer 303 may be provided and a second bonding layer 307 may be formed on the second semiconductor die 200.

With reference to FIG. 3, the second semiconductor die 200 and the first semiconductor die 100 may provide different functionalities. For example, the first semiconductor die 100 may provide a logic function and the second semiconductor die 200 may provide a memory function. In some embodiments, the first semiconductor die 100 and the second semiconductor die 200 may provide the same functionality.

With reference to FIG. 3, the second semiconductor die 200 may have a similar structure with the first semiconductor die 100. The second semiconductor die 200 may include a second substrate 201, a second dielectric layer 203, second devices 205 (only show one for clarity), a second conductive layer 207, and a second etch stop layer 303. The similar reference numbers between the first semiconductor die 100 and the second semiconductor die 200 may be formed of a same material and may be formed by a similar process but is not limited thereto. For example, the second substrate 201 may be formed of a same material as the first substrate 101.

In some embodiments, the second conductive layer 207 may be formed in the second dielectric layer 203. The second conductive layer 207 may be a back end conductive line of the second semiconductor die 200. The second conductive layer 207 may be formed of for example, copper, aluminum, titanium, tungsten, the like, or a combination thereof.

In some embodiments, the second conductive layer 207 may be a pad layer of the second semiconductor die 200. The top surface of the second conductive layer 207 may be substantially coplanar with the top surface of the second dielectric layer 203. The second conductive layer 207 may be formed of a same material as the first conductive layer 107 but is not limited thereto.

With reference to FIG. 3, the second etch stop layer 303 may be formed on the second conductive layer 207 and in the second dielectric layer 203. The second etch stop layer 303 may be formed by chemical vapor deposition, plasma-enhanced chemical vapor deposition, or the like and the second etch stop layer 303 may be formed during the formation of the second dielectric layer 203.

With reference to FIG. 3, the second bonding layer 307 may be formed on the second semiconductor die 200. Specifically, the second bonding layer 307 may be formed on the second dielectric layer 203. The second bonding layer 307 may be formed of a same material as the first bonding layer 305. In some embodiments, dummy conductive layers (not shown for clarity) may be formed in the second bonding layer 307. The top surfaces of the dummy conductive layers may be substantially coplanar with the top surface of the second bonding layer 307.

Figure 4:
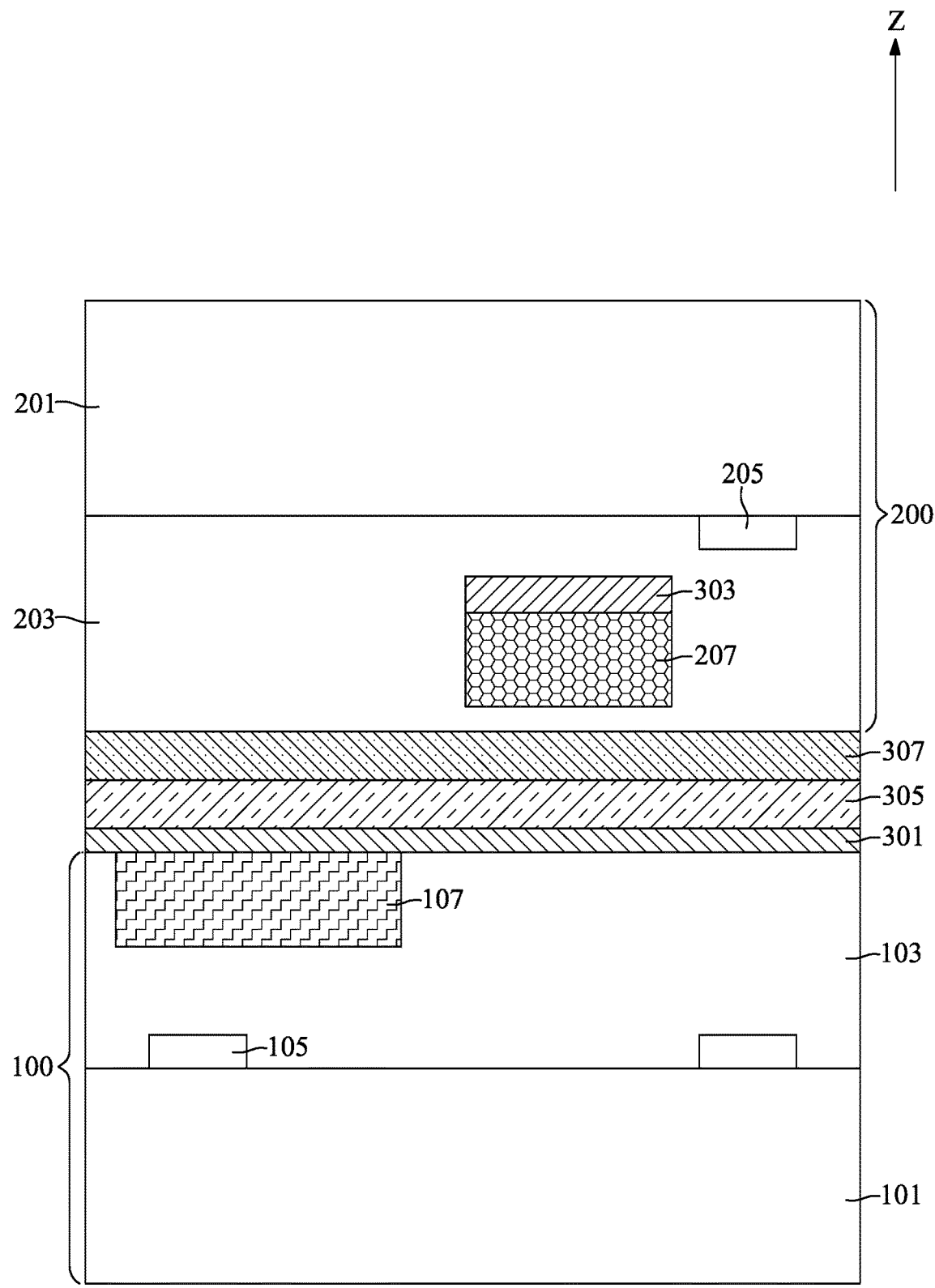

With reference to FIGS. 1 and 4, at step S15, the second semiconductor die 200 may be bonded onto the first semiconductor die 100 in an up-side down manner through a bonding process.

With reference to FIG. 4, the second semiconductor die 200 and the first semiconductor die 100 may be bonded in a face-to-face manner. Specifically, the second bonding layer 307 may be placed on the first bonding layer 305 during the bonding process. The second dielectric layer 203 may be on the second bonding layer 307. The second substrate 201 may be on the second dielectric layer 203. The second conductive layer 207 may be above the first etch stop layer 301. The second etch stop layer 303 may be on the second conductive layer 207. In some embodiments, the second semiconductor die 200 and the first semiconductor die 100 may be bonded in a back-to-face manner.

In some embodiments, a thermal treatment may be performed to achieve a hybrid bonding between elements of the first bonding layer 305 and the second bonding layer 307 for the bonding process. A temperature of bonding process may be between about 300° C. and about 450° C. The hybrid bonding may include a dielectric-to-dielectric bonding and/or a metal-to-metal bonding. The dielectric-to-dielectric bonding may originate from the bonding between the first bonding layer 305 and the second bonding layer 307. The metal-to-metal bonding may originate from the bonding between the dummy conductive layers in the first bonding layer 305 and the second bonding layer 307. That is, the dummy conductive layers may facilitate the bonding process between the first semiconductor die 100 and the second semiconductor die 200.

In some embodiments, the first etch stop layer 301 and the second etch stop layer 303 may be formed of a same material such as silicon nitride, silicon oxynitride, silicon nitride oxide, or silicon carbonitride. The thickness T2 of the second etch stop layer 303 may be greater than the thickness T1 of the first etch stop layer 301. The ratio of the thickness T2 of the second etch stop layer to the thickness T1 of the first etch stop layer is between about 1.1 and about 2.0. The greater thickness T2 of the second etch stop layer 303 may compensate the adverse effect originating from over etching during the formation of the via openings which will be illustrated later.

It should be noted that, in the present disclosure, silicon oxynitride refers to a substance which contains silicon, nitrogen, and oxygen and in which a proportion of oxygen is greater than that of nitrogen. Silicon nitride oxide refers to a substance which contains silicon, oxygen, and nitrogen and in which a proportion of nitrogen is greater than that of oxygen.

In some embodiments, the first etch stop layer 301 and the second etch stop layer 303 may be formed of different materials. For example, the first etch stop layer 301 may be formed of a material having etching selectivity to the second etch stop layer 303. The first etch stop layer 301 and the second etch stop layer 303 may be formed of, for example, silicon oxide, silicon nitride, silicon oxynitride, silicon nitride oxide, silicon carbonitride, silicon boron nitride, or boron carbon silicon nitride. In some embodiments, the first etch stop layer 301 and the second etch stop layer 303 have a same thickness. In some embodiments, the first etch stop layer 301 and the second etch stop layer 303 may have different thicknesses. The thickness T1 of the first etch stop layer 301 and the thickness T2 of the second etch stop layer 303 may be determined according to the etching selectivity of the first etch stop layer 301 to the second etch stop layer 303.

Figure 5:
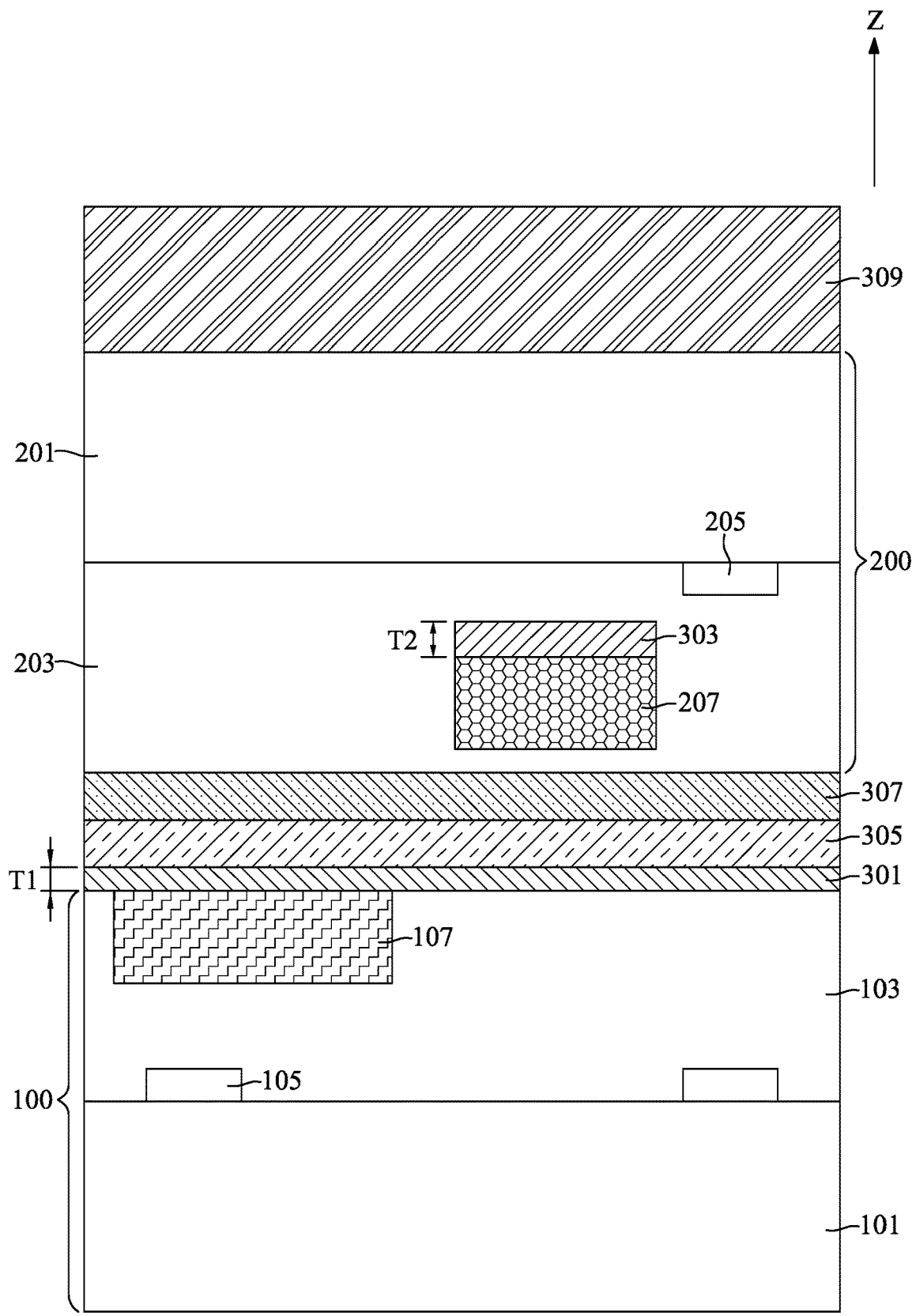
Figure 6:
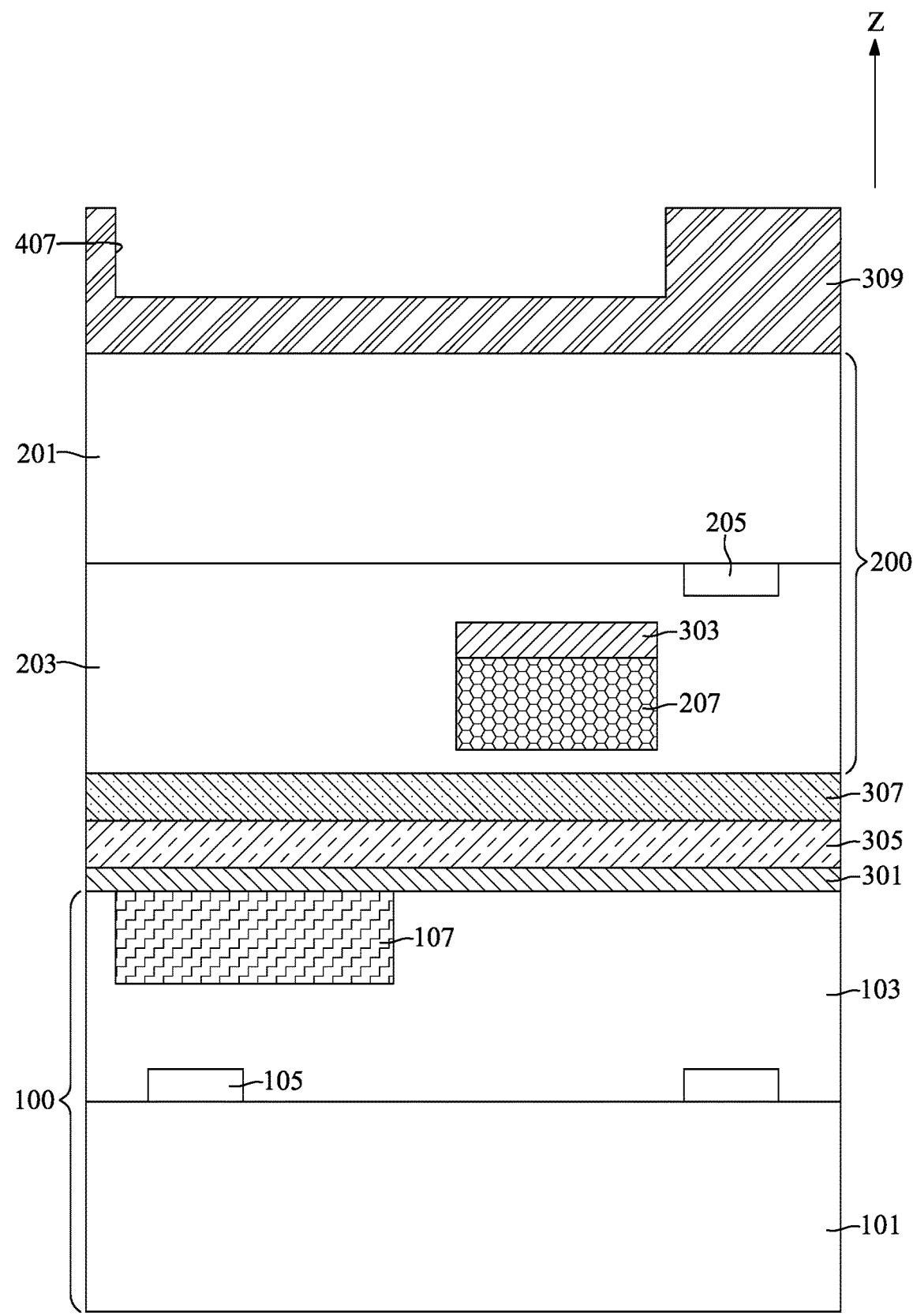

With reference to FIGS. 1, 5, and 6, at step S17, a first passivation layer 309 may be formed on the second substrate 201 of the second semiconductor die 200 and a first opening 401 may be formed in the first passivation layer 309.

With reference to FIG. 5, the first passivation layer 309 may be formed on the second substrate 201 by a deposition process such as chemical vapor deposition, plasma-enhanced chemical vapor deposition, evaporation, or spin-on coating. In some embodiments, the first passivation layer 309 may be formed of, for example, a non-organic material selected from silicon nitride, silicon oxynitride, silicon oxide, silicon nitride oxide, and combinations thereof. In some embodiments, the passivation layer 301 may be formed of, for example, a polymer layer such as epoxy, polyimide, benzocyclobutene, polybenzoxazole, or the like.

In some embodiments, the second substrate 201 may be thinned by a thinning process before the formation of the first passivation layer 309. The thinning process may be an etch process, a chemical polishing process, or a grinding process.

With reference to FIG. 6, the first opening 401 may be formed in the first passivation layer 309 by a photolithography process and a subsequent etch process.

Figure 7:
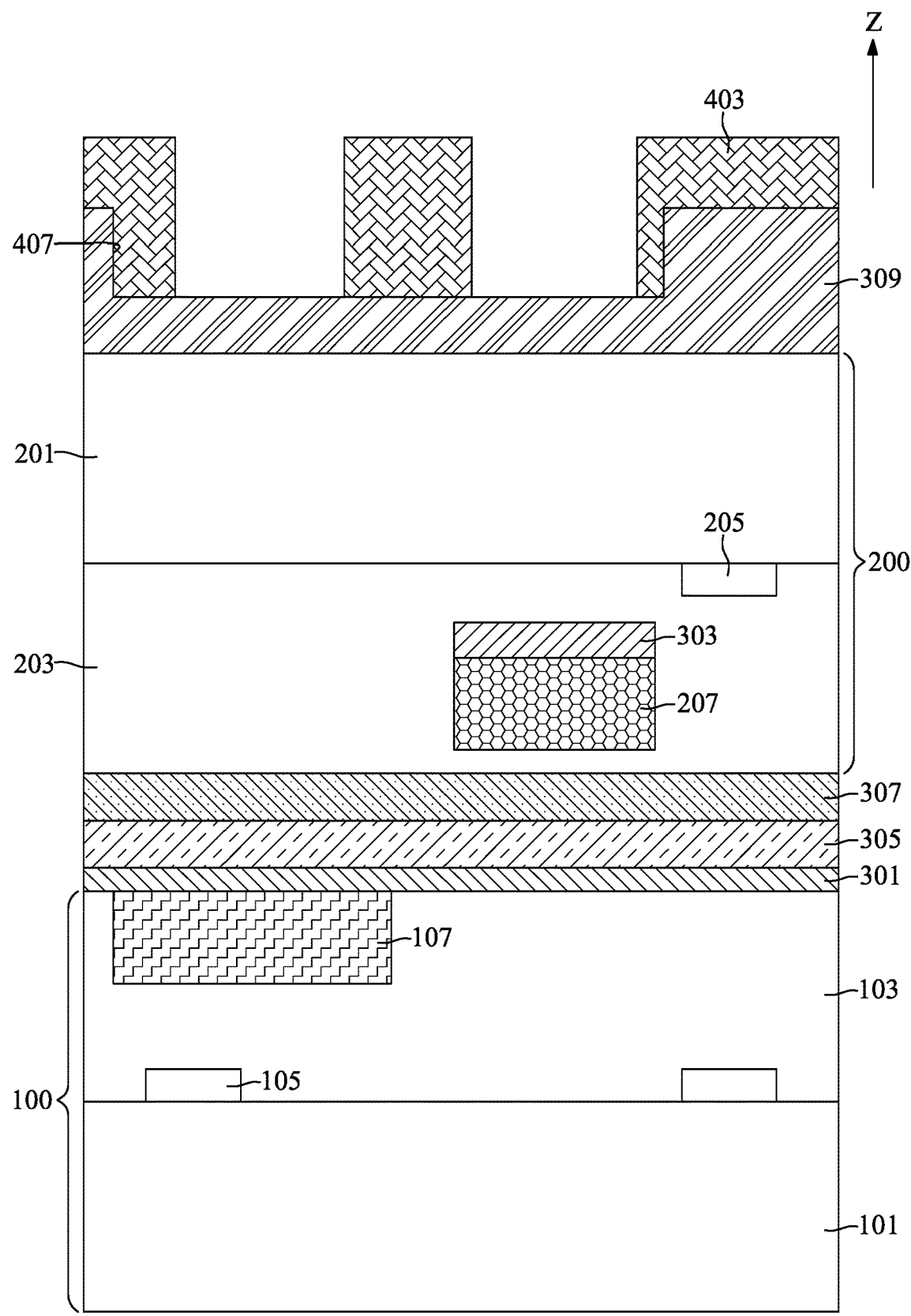
Figure 8:
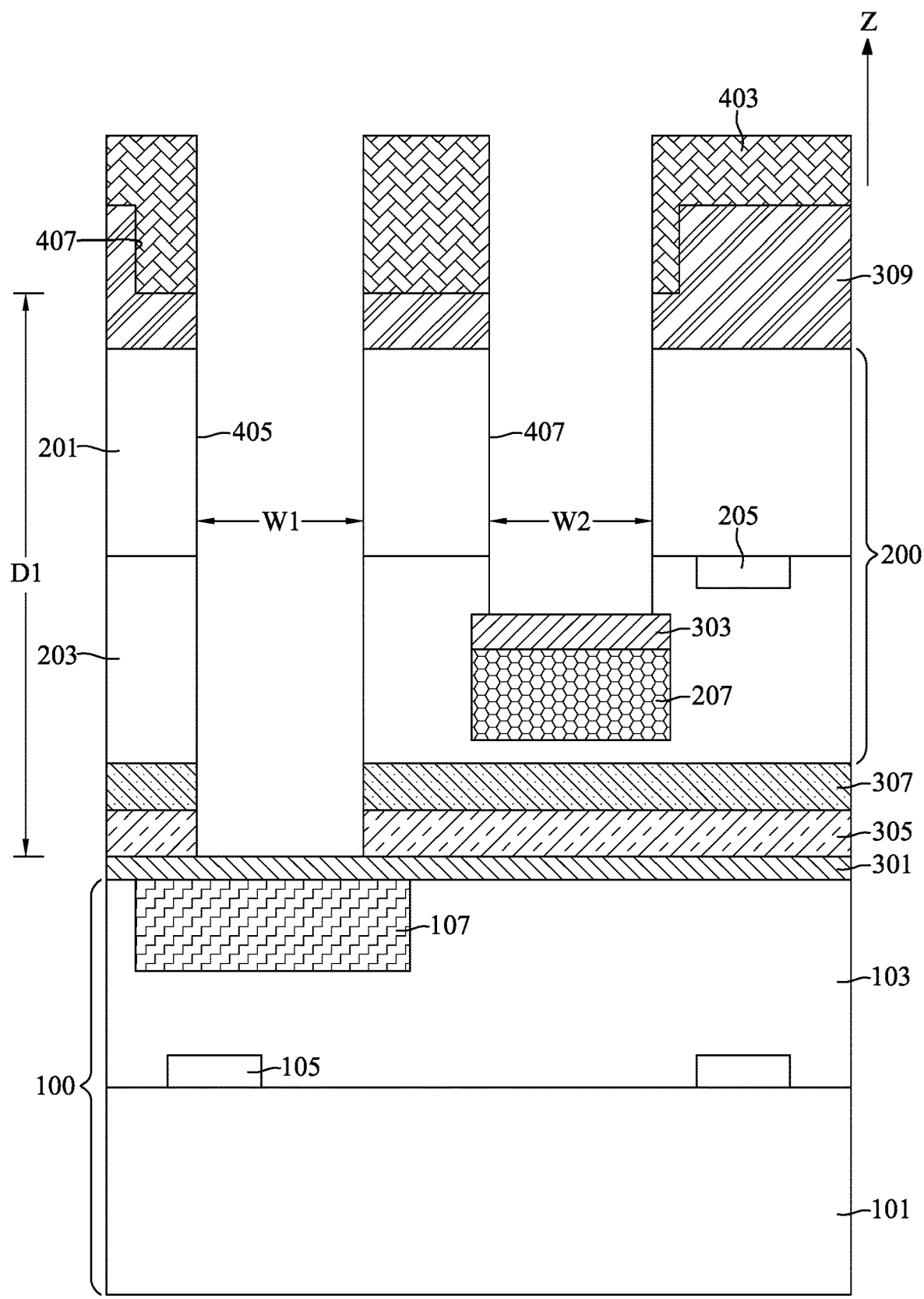

With reference to FIGS. 1, 7, and 8, at step S19, a first via opening 405 and a second via opening 407 may be concurrently formed to expose the first etch stop layer 301 and the second etch stop layer 303.

With reference to FIG. 7, a first mask layer 403 may be formed on the first passivation layer 309 and in the first opening 401 by a photolithography process. The first mask layer 403 may have the pattern of the first via opening 405 and the second via opening 407.

With reference to FIG. 8, a via etch process may be performed to concurrently form the first via opening 405 and the second via opening 407. In some embodiments, the via etch process may be a multi-step anisotropic dry etch process. The first via opening 405 may be formed extending form the first opening 401, along the first passivation layer 309, along the second substrate 201, along the second dielectric layer 203, along the second bonding layer 307, along the first bonding layer 305, and exposing a portion of the first etch stop layer 301. The second via opening 407 may be formed extending from the first opening 401, along the first passivation layer 309, along the second substrate 201, extending to the second dielectric layer 203, and exposing a portion of the second etch stop layer 303.

With reference to FIG. 8, a width W1 of the first via opening 405 may be equal to or less than a width W2 of the second via opening 407. In some embodiments, the width W2 of the second via opening 407 may be between about 5 μm and about 15 μm. In some embodiments, the first via opening 405 may have a depth D1 between about 20 μm and about 160 μm. Specifically, the depth D1 of the first via opening 405 may be between about 50 μm and about 130 μm. In some embodiments, the first via opening 405 may have an aspect ratio between about 1:8 and about 1:35. Specifically, the aspect ratio of the first via opening 405 may be between about 1:13 and about 1:25. In some embodiments, the second via opening 407 may have an aspect ratio between about 1:6 and about 1:15. Specifically, the aspect ratio of the second via opening 407 may be between about 1:7 and about 1:12.

In some embodiments, the first via opening 405 and the second via opening 407 may have a slight positive slope and/or a tapered profile near their upper portions. Such tapered profiles may improve diffusion of metal ions within the first via opening 405 and the second via opening 407 and may reduce the time for filling the first via opening 405 and the second via opening 407.

Conventionally, for concurrently forming the first via opening 405 and second via opening 407 with different aspect ratios, the etch duration of the via etch process may have to be long enough to form the deeper via opening (i.e., the first via opening 405 for the present embodiment). In such situation, the shallower via opening (i.e., the second via opening 407) may be over etched. As a result, the second etch stop layer 303 may be completely removed and the second conductive layer 207 may be damaged.

In some embodiments, to overcome the aforementioned issue, the via etch process may include etchants rich in carbon and halogen. For example, the etchants may be perfluoroisobutylene and/or hexafluorobutadiene. The carbon/halogen rich etchants may react with the second etch stop layer 303 and/or the first etch stop layer 301 formed of silicon nitride, silicon oxynitride, or silicon carbonitride to form polymeric byproducts. The polymeric byproducts may serve as protection layers to alleviate the adverse effect due to the over etching of the via etch process. In addition, the greater thickness of the second etch stop layer 303 may be severed as a buffer to compensate the adverse effect of the over etching.

In some embodiments, the first etch stop layer 301 may be formed of a material having etching selectivity to the second etch stop layer 303 during the via etch process. For example, the etch rate ratio of the first etch stop layer 301 to the second etch stop layer 303 may be between about 1.05:1 and about 25:1; specifically, between about 1.5:1 and about 15:1 during the via etch process. In such situation, the thickness T1 of the first etch stop layer 301 and the thickness T2 of the second etch stop layer 303 may be tailored according to the etch rate ratio of the first etch stop layer 301 to the second etch stop layer 303 during the via etch process. After the formation of the first via opening 405 and the second via opening 407, the first mask layer 403 may be removed.

In some embodiments, the second etch stop layer 303 may be formed of a material having etch selectivity to the second dielectric layer 203. For example, the etch rate ratio of the first etch stop layer 301 to the second etch stop layer 303 may be between about 1.05:1 and about 25:1; specifically, between about 1.5:1 and about 15:1 during the via etch process.

Figure 9:
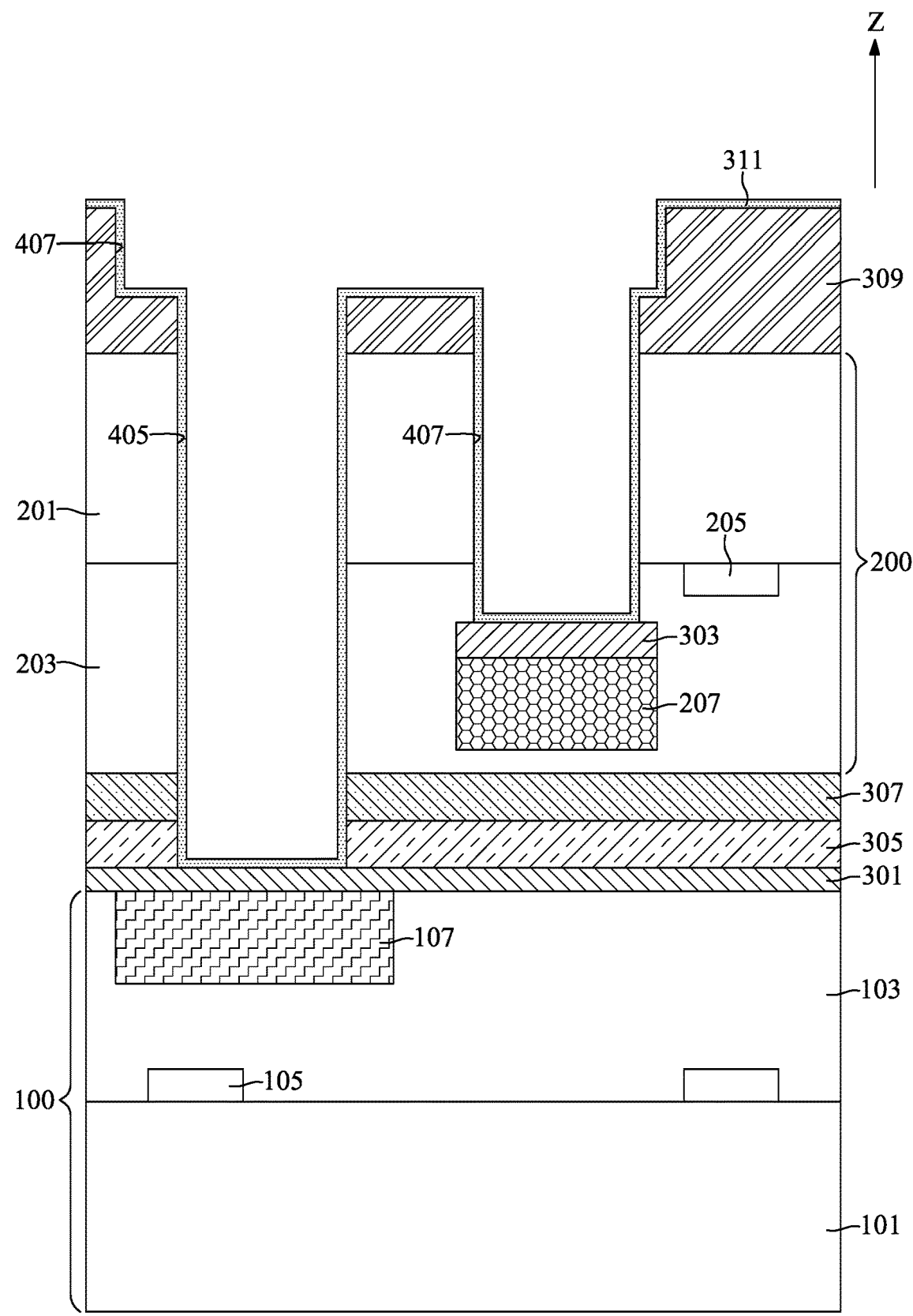

With reference to FIGS. 1 and 9, at step S21, an isolation layer 311 may be conformally form in the first opening 401, the first via opening 405, and the second via opening 407.

With reference to FIG. 9, in some embodiments, the isolation layer 311 may be formed of, for example, silicon oxide, silicon nitride, silicon oxynitride, tetra-ethyl orthosilicate, or combination thereof. The isolation layer 311 may have a thickness between about 50 nm and about 200 nm. The isolation layer 311 may be formed by, for example, chemical vapor deposition or plasma-enhanced chemical vapor deposition. In some embodiments, the isolation layer 311 may be formed of for example, parylene, epoxy, or poly(p-xylene). The isolation layer 311 may have a thickness between about 1 μm and about 5 μm. The isolation layer 311 may be formed by, for example, spin-on coating with a subsequent curing.

Figure 10:
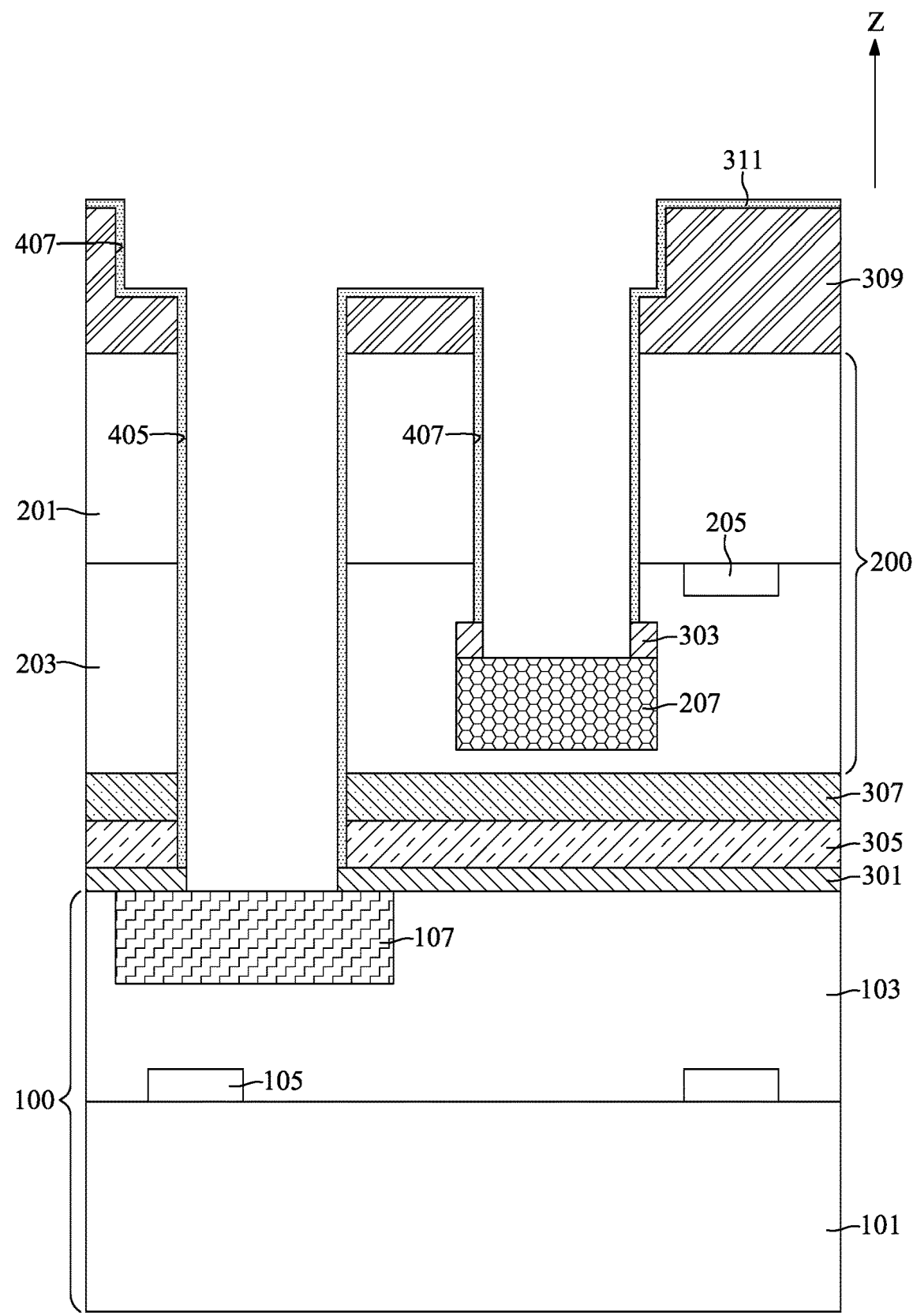

With reference to FIGS. 1 and 10, at step S23, a punch etch process may be performed to expand the first via opening 405 and the second via opening 407.

With reference to FIG. 10, the portion of isolation layer 311 formed on the first etch stop layer 301, the portion of first etch stop layer 301 formed on the first conductive layer 107, the portion of isolation layer 311 formed on the second etch stop layer 303, and the portion of second etch stop layer 303 formed on the second conductive layer 207 may be removed by the punch etch process. The isolation layer 311 may be divided into multiple segments after the punch etch process. The first conductive layer 107 may be exposed through the first via opening 405. The second conductive layer 207 may be exposed through the second via opening 407. In some embodiments, the punch etch process may be a multi-step anisotropic dry etch process. In some embodiments, the punch etch process may include tetrafluoromethane.

It should be noted that, in the present disclosure, the term "segment" may be interchangeably used with the term "portion."

With reference to FIG. 1 and FIGS. 11 to 15, at step S25, a first through substrate via 321 may be formed in the first via opening 405 and a second through substrate via 323 may be formed in the second via opening 407.

Figure 11:
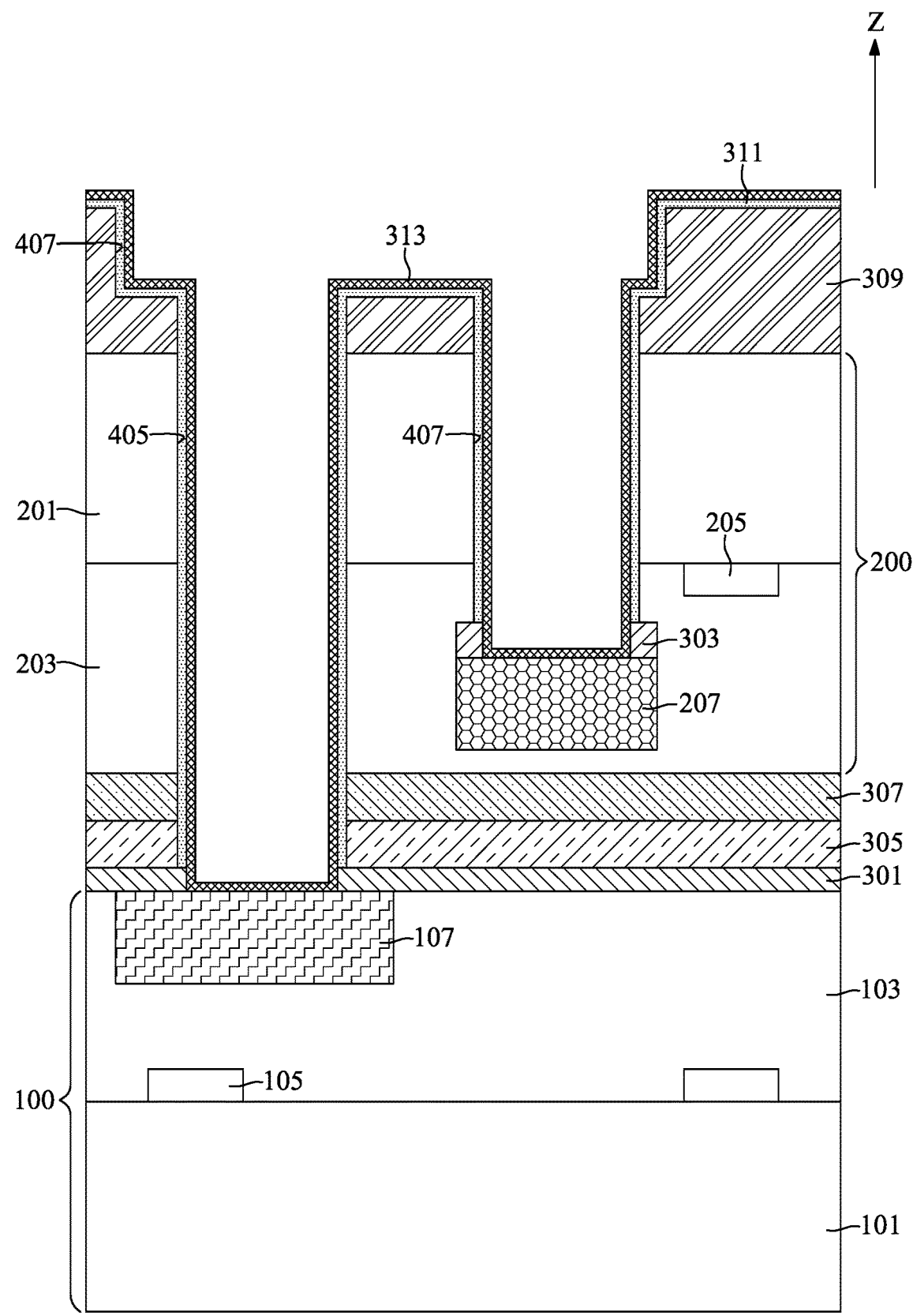

With reference to FIG. 11, a barrier layer 313 may be conformally formed on the first conductive layer 107, on the second conductive layer 207, and on the isolation layer 311. The barrier layer 313 may be in the first opening 401, in the first via opening 405, and in the second via opening 407. The barrier layer 313 may have a thickness between about 5 nm and about 50 nm. The barrier layer 313 may be formed of for example, tantalum, tantalum nitride, titanium, titanium nitride, rhenium, nickel boride, or tantalum nitride/tantalum bilayer. The barrier layer 313 may be formed by deposition process such as physical vapor deposition, atomic layer deposition, chemical vapor deposition, or sputtering. The barrier layer 313 may inhibit diffusion of the conductive materials of the first through substrate via 321 and the second through substrate via 323 into the first semiconductor die 100 or the second semiconductor die 200.

Figure 12:
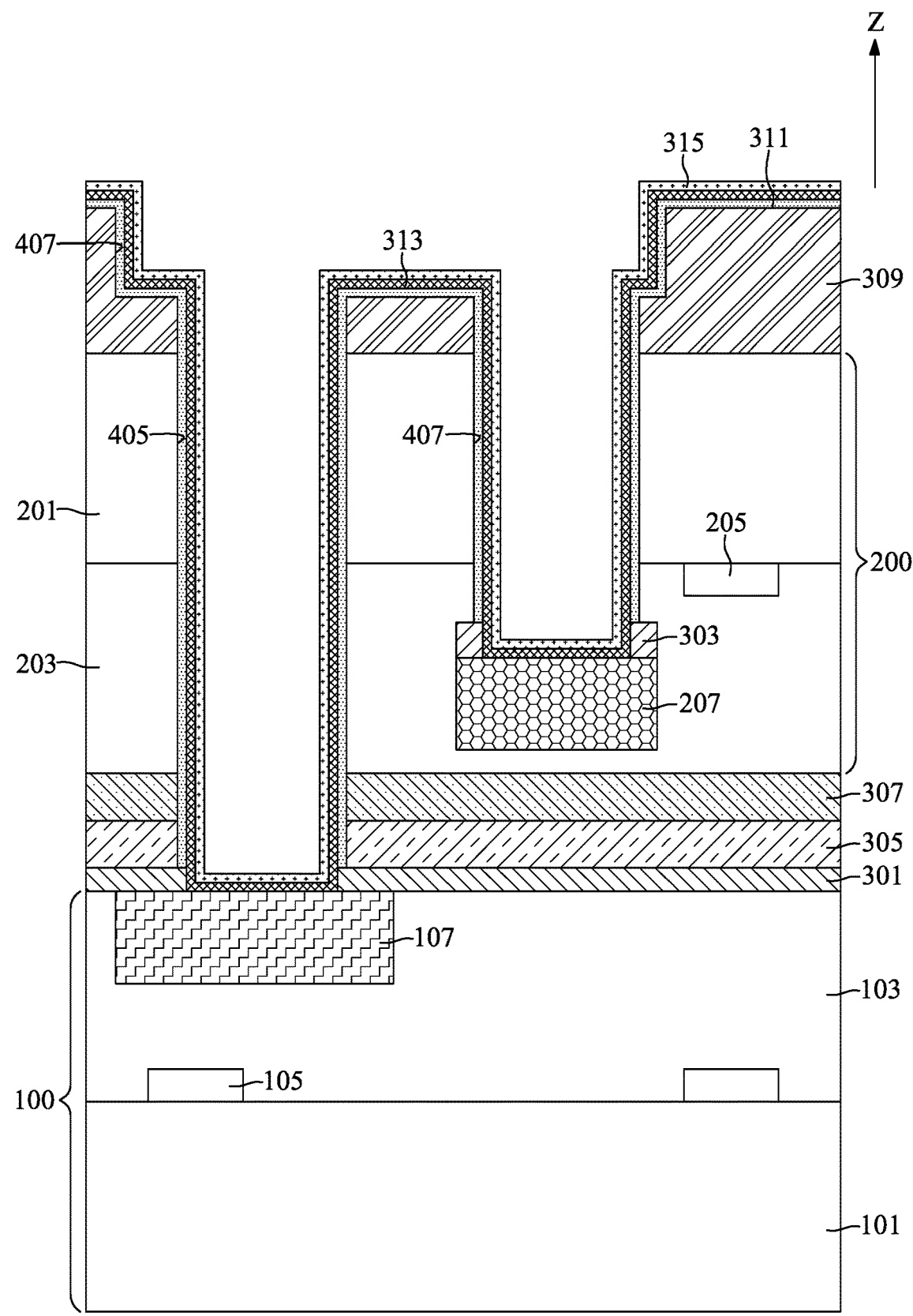

With reference to FIG. 12, an adhesion layer 315 may be conformally formed on the barrier layer 313, in the first opening 401, in the first via opening 405, and in the second via opening 407. The adhesion layer 315 may have a thickness between about 5 nm and about 50 nm. The adhesion layer 315 may be formed of, for example, titanium, tantalum, titanium tungsten, or manganese nitride. The adhesion layer 315 may be formed by deposition process such as physical vapor deposition, atomic layer deposition, chemical vapor deposition, or sputtering. The adhesion layer 315 may improve an adhesion between a seed layer, which will be fabricated later, and the barrier layer 313.

Figure 13:
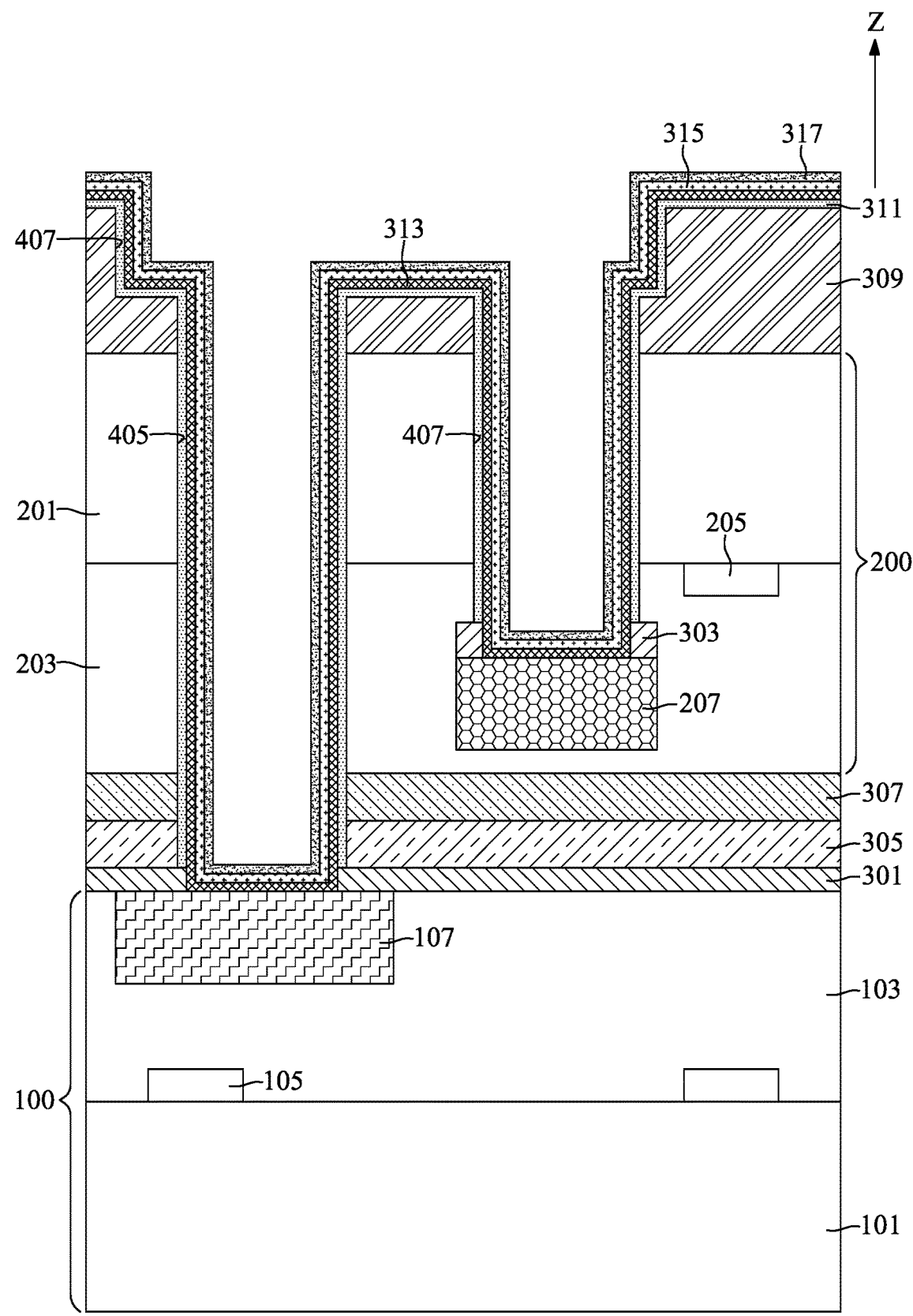

With reference to FIG. 13, a seed layer 317 may be formed on the adhesion layer 315, in the first opening 401, in the first via opening 405, and in the second via opening 407. The seed layer may have a thickness between about 10 nm and about 40 nm. The seed layer 317 may be formed of, for example, copper or ruthenium. The seed layer 317 may be formed by deposition process such as physical vapor deposition, atomic layer deposition, chemical vapor deposition, or sputtering. The seed layer 317 may reduce electrical resistance of the first via opening 405 and the second via opening 407 during the formation of the first through substrate via 321 and the second through substrate via 323 by an electroplating process.

Figure 14:
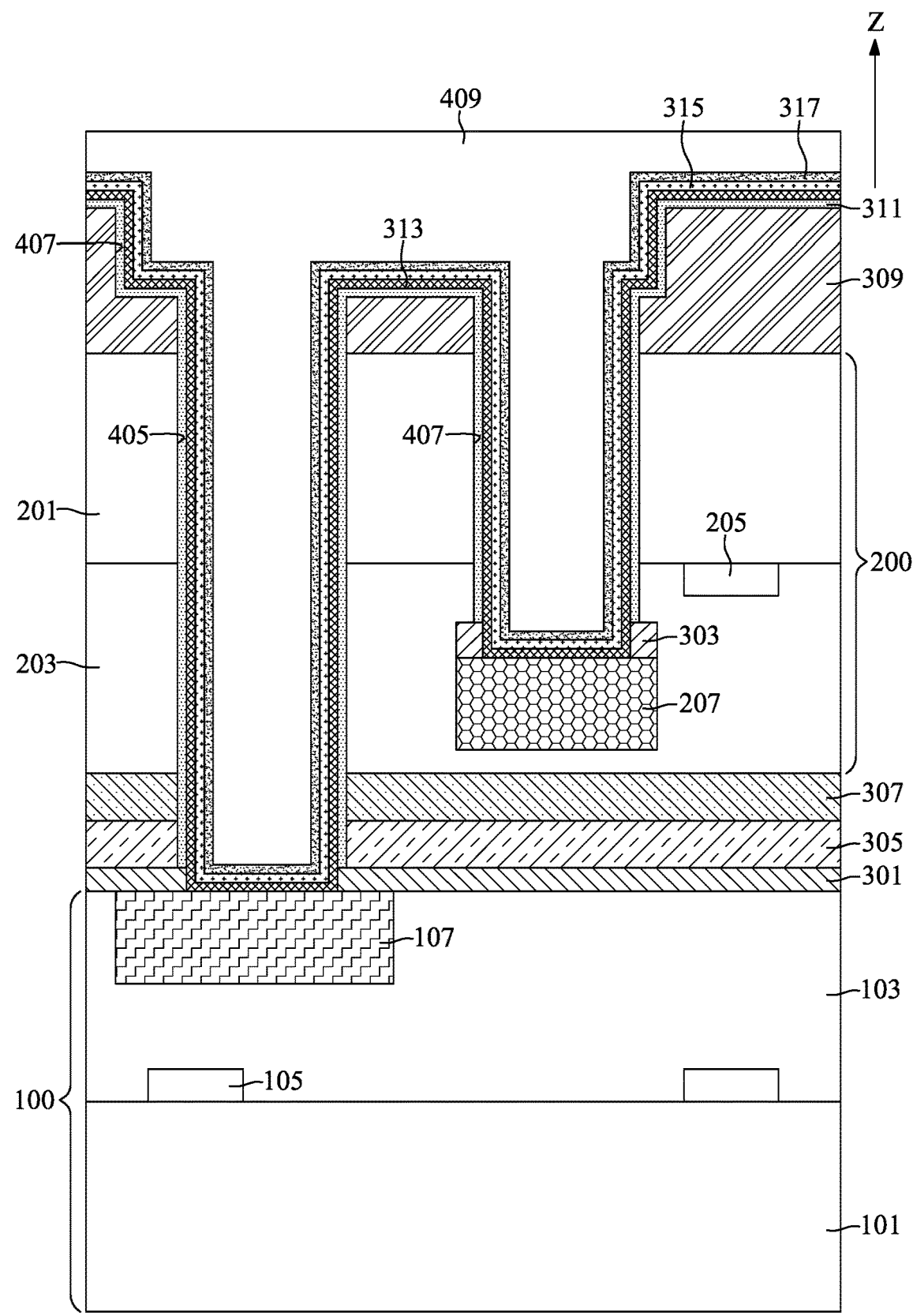

With reference to FIG. 14, a layer of filler material 409 may be formed to completely fill the first via opening 405, the second via opening 407, and the first opening 401. The layer of filler material 409 may be, for example, copper. The layer of filler material 409 may be formed by an electroplating process using a plating solution. The plating solution may include copper sulfate, copper methane sulfonate, copper gluconate, copper sulfamate, copper nitrate, copper phosphate, or copper chloride. The pH of the plating solution may be between about 2 to 6; specifically, between about 3 to 5. The process temperature of the electroplating process may be maintained between about 40° C. and about 75° C.; specifically, between about 50° C. and about 70° C.

In some embodiments, the plating solution may include accelerators, suppressors, or levelers. The accelerators may include a polar sulfur, oxygen, or nitrogen functional group that help to increase deposition rates and may promote dense nucleation. The accelerators may be present at a low concentration level, for example, between about 0 and about 200 ppm. The suppressors are additives that reduce the plating rate and are usually present in the plating bath at higher concentrations, for example, between about 5 ppm and about 1000 ppm. The suppressors may be polymeric surfactants with high molecular weight, such as polyethylene glycol.

The suppressors may slow down the deposition rate by adsorbing on the surface and forming a barrier layer to the copper ions. Because of their large size and low diffusion rate, the suppressors are less likely to reach the lower parts of the first via opening 405 and the second via opening 407. Therefore, most of suppressing effect may occur at the lower parts of the first via opening 405 and the second via opening 407, helping to reduce overburden of the layer of filler material 409 and avoid the first via opening 405 and the second via opening 407 "closing".

The leveler may be used to improve filling performance, decrease the surface roughness and prevent copper deposition at the upper parts of the first via opening 405 and the second via opening 407. The levelers may be present in a small concentrations, for example, between about 1 ppm and about 100 ppm. The levelers may be, for example, 3-mercapto-1-propanesulfonate, (3-sulfopropyl) disulfide, or 3,3-thiobis (1-propanesulfonate).

In some embodiments, an annealing process may be performed after the formation of the layer of filler material 409. The annealing process may reduce the adverse effects of copper-pumping during subsequent semiconductor processes, improve the adhesion between the layer of filler material 409 and the isolation layer 311, and stabilize the microstructure of the layer of filler material 409.

Figure 15:
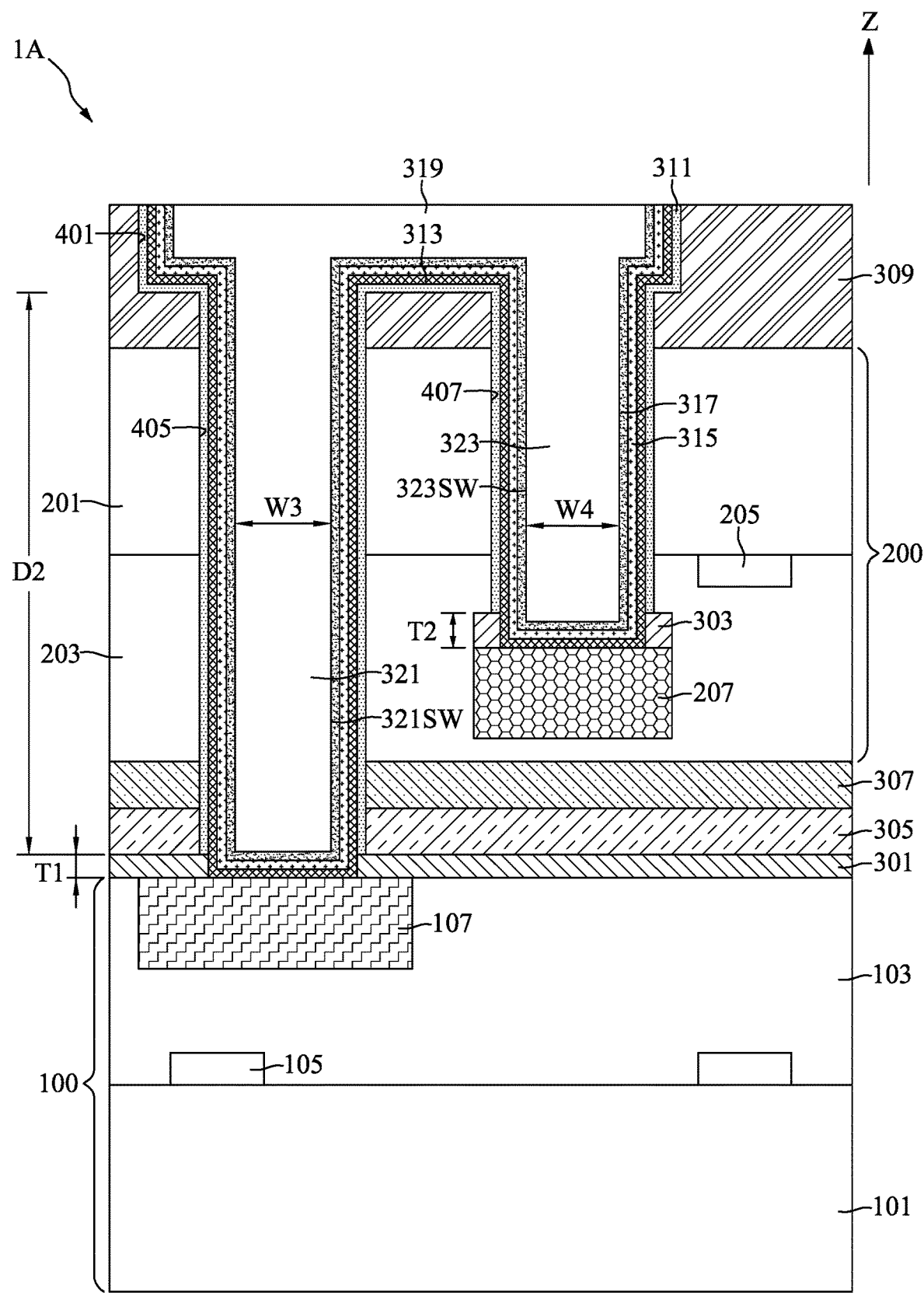

With reference to FIG. 15, a planarization process, such as chemical mechanical polishing, may be performed until the top surface of the first passivation layer 309 is exposed to remove excess material, provide a substantially flat surface for subsequent processing steps, and concurrently form the top conductive layer 319 in the first opening 401, the first through substrate via 321 in the first via opening 405, and the second through substrate via 323 in the second via opening 407.

With reference to FIG. 15, the top conductive layer 319 may be disposed on the first through substrate via 321 and the second through substrate via 323. The first through substrate via 321 may be disposed along the first passivation layer 309, along the second substrate 201, along the second dielectric layer 203, along the second bonding layer 307, along the first bonding layer 305, along the first etch stop layer 301, extending to the first dielectric layer 103, and on the first conductive layer 107. The second through substrate via 323 may be disposed along the first passivation layer 309, along the second substrate 201, extending to the second dielectric layer 203, along the second etch stop layer 303, and on the second conductive layer 207.

With reference to FIG. 15, a width W3 of the first through substrate via 321 may be equal to or less than a width W4 of the second through substrate via 323. In some embodiments, the width W4 of the second through substrate via 323 may be between about 5 µm and about 15 µm. In some embodiments, the first through substrate via 321 may have a depth D2 between about 20 µm and about 160 µm. Specifically, the depth D2 of the first through substrate via 321 may be between about 50 µm and about 130 µm. In some embodiments, the first through substrate via 321 may have an aspect ratio between about 1:8 and about 1:35. Specifically, the aspect ratio of the first through substrate via 321 may be between about 1:13 and about 1:25. In some embodiments, the second through substrate via 323 may have an aspect ratio between about 1:6 and about 1:15. Specifically, the aspect ratio of the second through substrate via 323 may be between about 1:7 and about 1:12.

With reference to FIG. 15, the isolation layer 311 may be disposed on the sidewalls 321SW of the first through substrate via 321 and the sidewalls 323SW of the second through substrate via 323. The barrier layer 313 may be disposed on the first conductive layer 107, on the second conductive layer 207, between the first through substrate via 321 and the isolation layer 311, and between the second through substrate via 323 and the isolation layer 311. The adhesion layer 315 may be disposed between the first conductive layer 107 and the first through substrate via 321, between the second conductive layer 207 and the second through substrate via 323, between the first through substrate via 321 and the isolation layer 311, and between the second through substrate via 323 and the isolation layer 311. The seed layer 317 may be disposed between the first conductive layer 107 and the first through substrate via 321, between the second conductive layer 207 and the second through substrate via 323, between the first through substrate via 321 and the isolation layer 311, and between the second through substrate via 323 and the isolation layer 311.

It should be noted that the same or similar reference numbers used throughout the drawings are used to denote the same or similar features, elements, or structures, and thus, a detailed explanation of the same or similar features, elements, or structures will not be repeated for each of the drawings.

FIGS. 16 to 20 illustrate, in schematic cross-sectional view diagrams, part of a flow for fabricating a semiconductor device 1B in accordance with another embodiment of the present disclosure.

Figure 16:
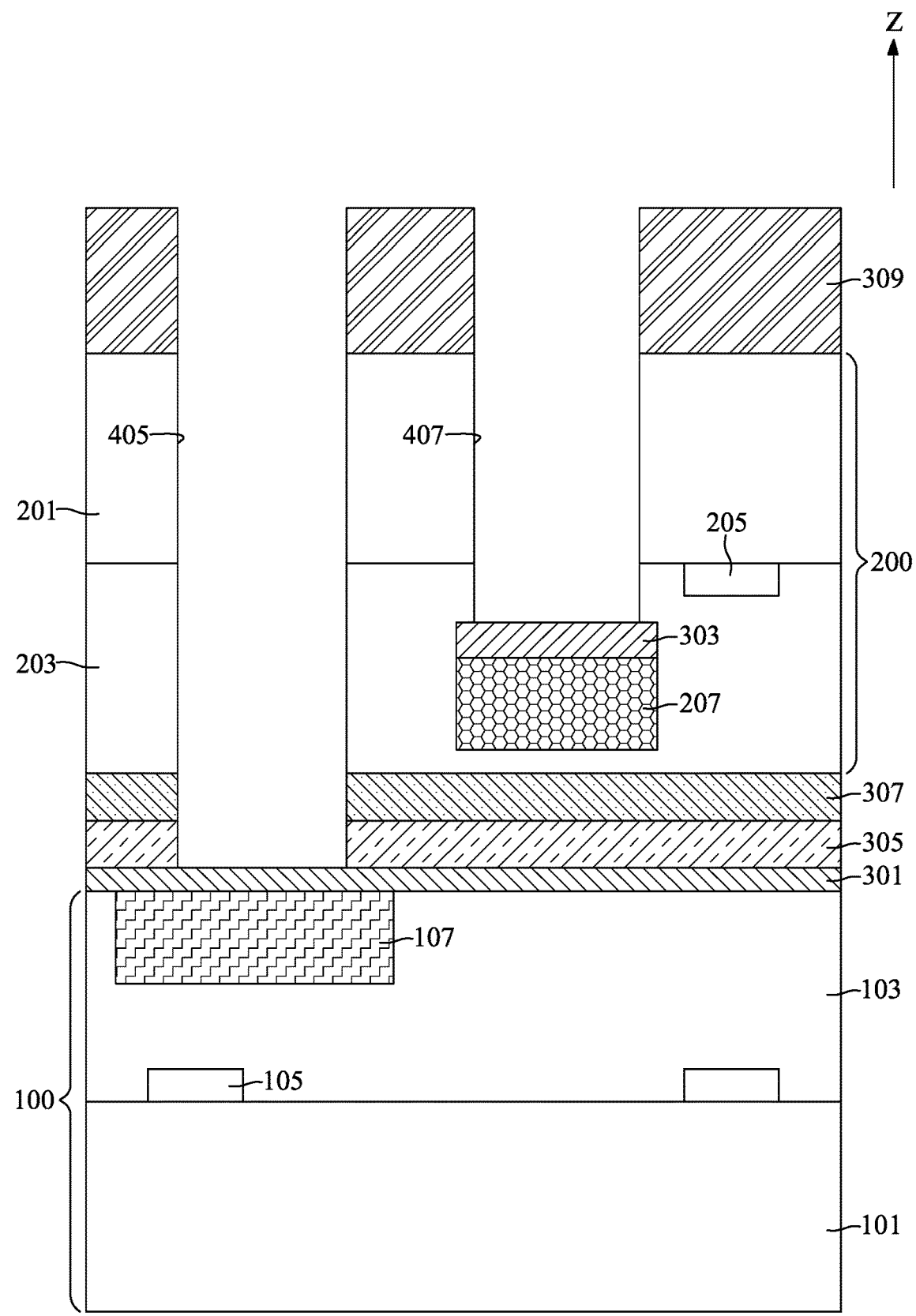
FIGS. 16 to 20 illustrate, in schematic cross-sectional view diagrams, part of a flow for fabricating a semiconductor device in accordance with another embodiment of the present disclosure.

With reference to FIG. 16, an intermediate semiconductor device may be fabricating with a procedure similar to that illustrated in FIGS. 2 to 5. The first via opening 405 may be formed along the first passivation layer 309, along the second substrate 201, along the second dielectric layer 203, along the second bonding layer 307, along the first bonding layer 305, and exposing a portion of the first etch stop layer 301. The second via opening 407 may be formed along the first passivation layer 309, along the second substrate 201, extending to the second dielectric layer 203, and exposing a portion of the second etch stop layer 303. It should be noted that no first opening in this embodiment.

Figure 17:
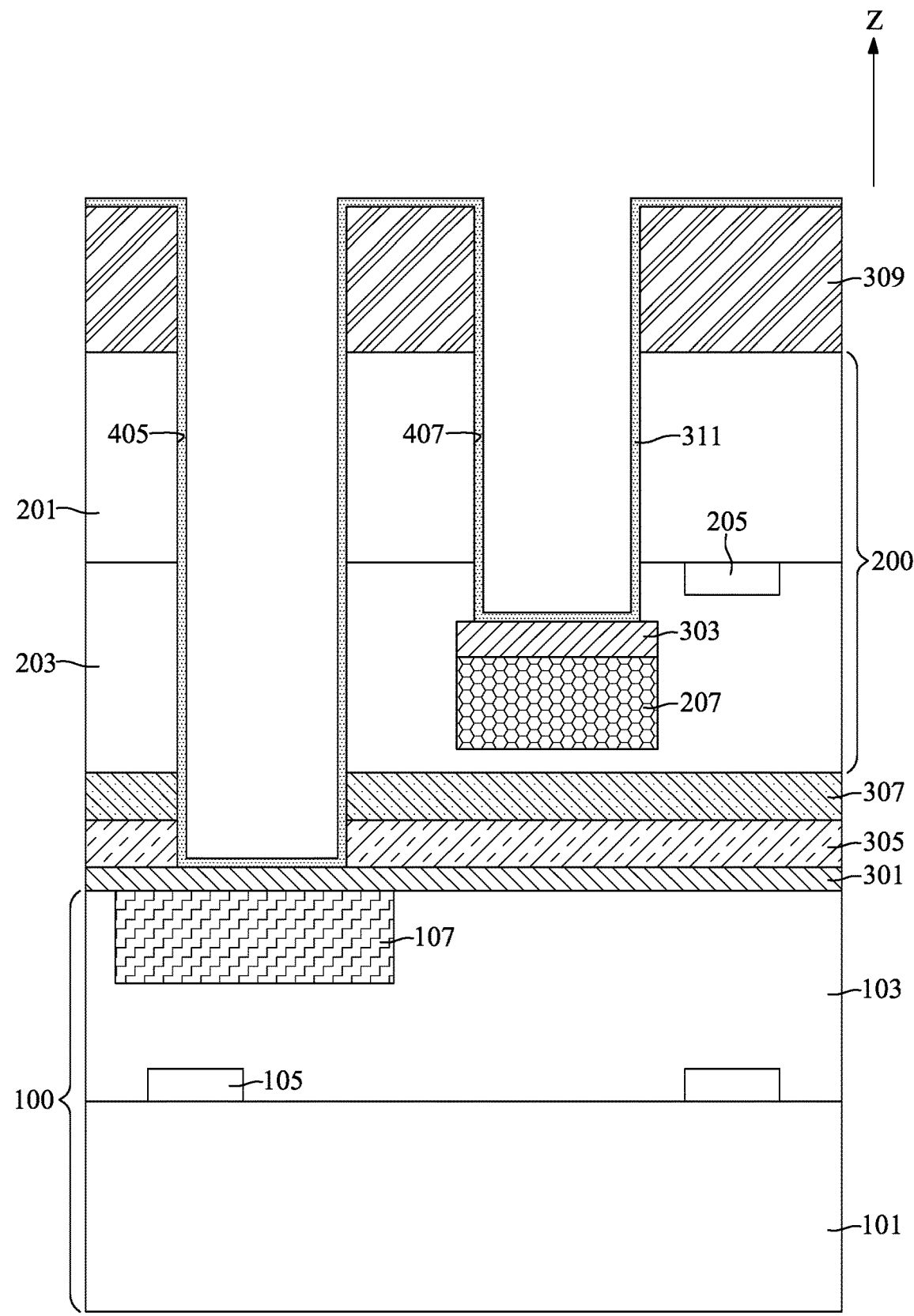

With reference to FIG. 17, the isolation layer 311 may be conformally formed in the first via opening 405 and the second via opening 407 with a procedure similar to that illustrated in FIG. 9.

Figure 18:
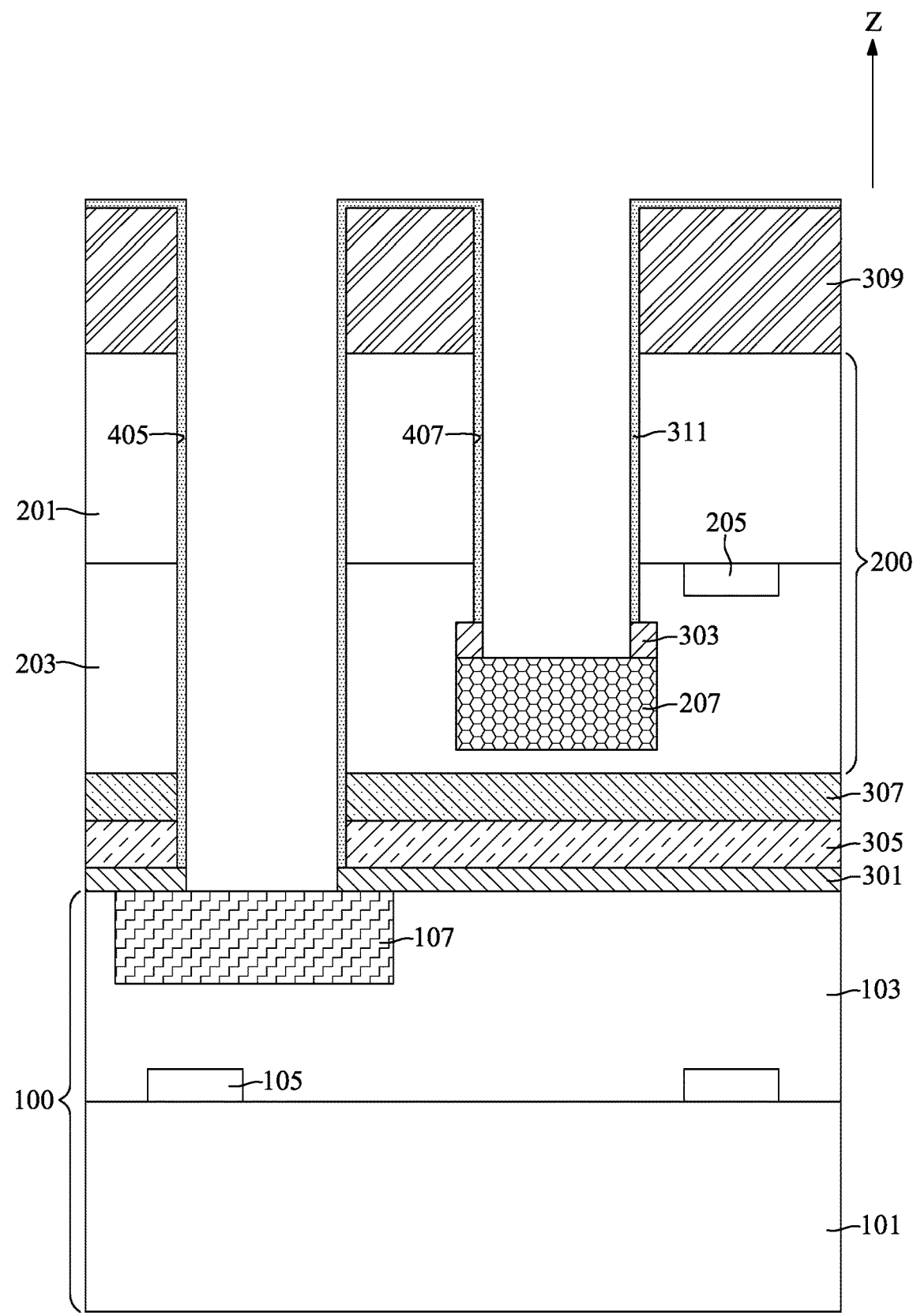

With reference to FIG. 18, the punch etch process may be performed to the intermediate semiconductor device illustrated in FIG. 17 with a procedure similar to that illustrated in FIG. 10.

Figure 19:
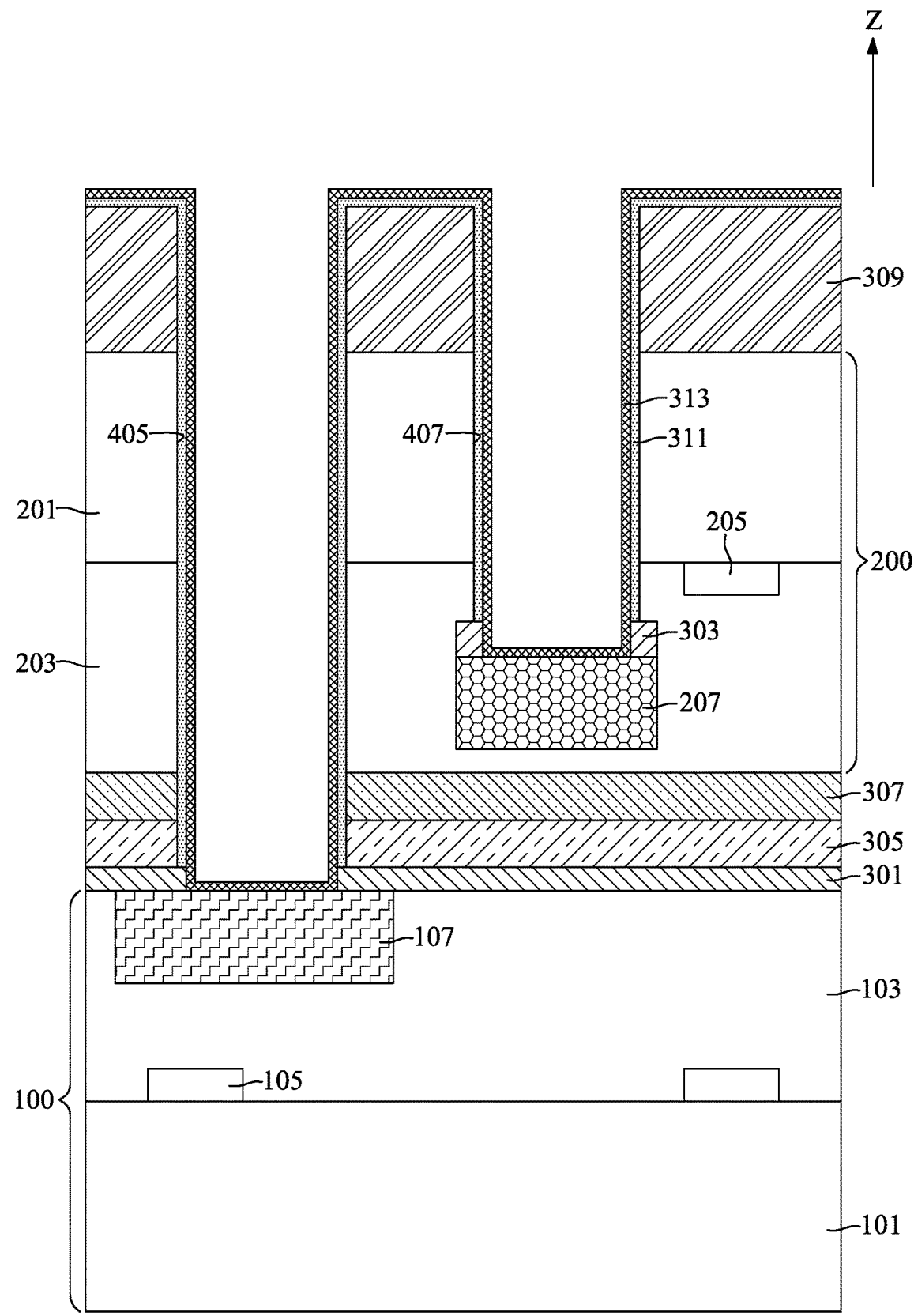

With reference to FIG. 19, the barrier layer 313 may be conformally formed in the first via opening 405 and the second via opening 407 with a procedure similar to that illustrated in FIG. 11.

Figure 20:
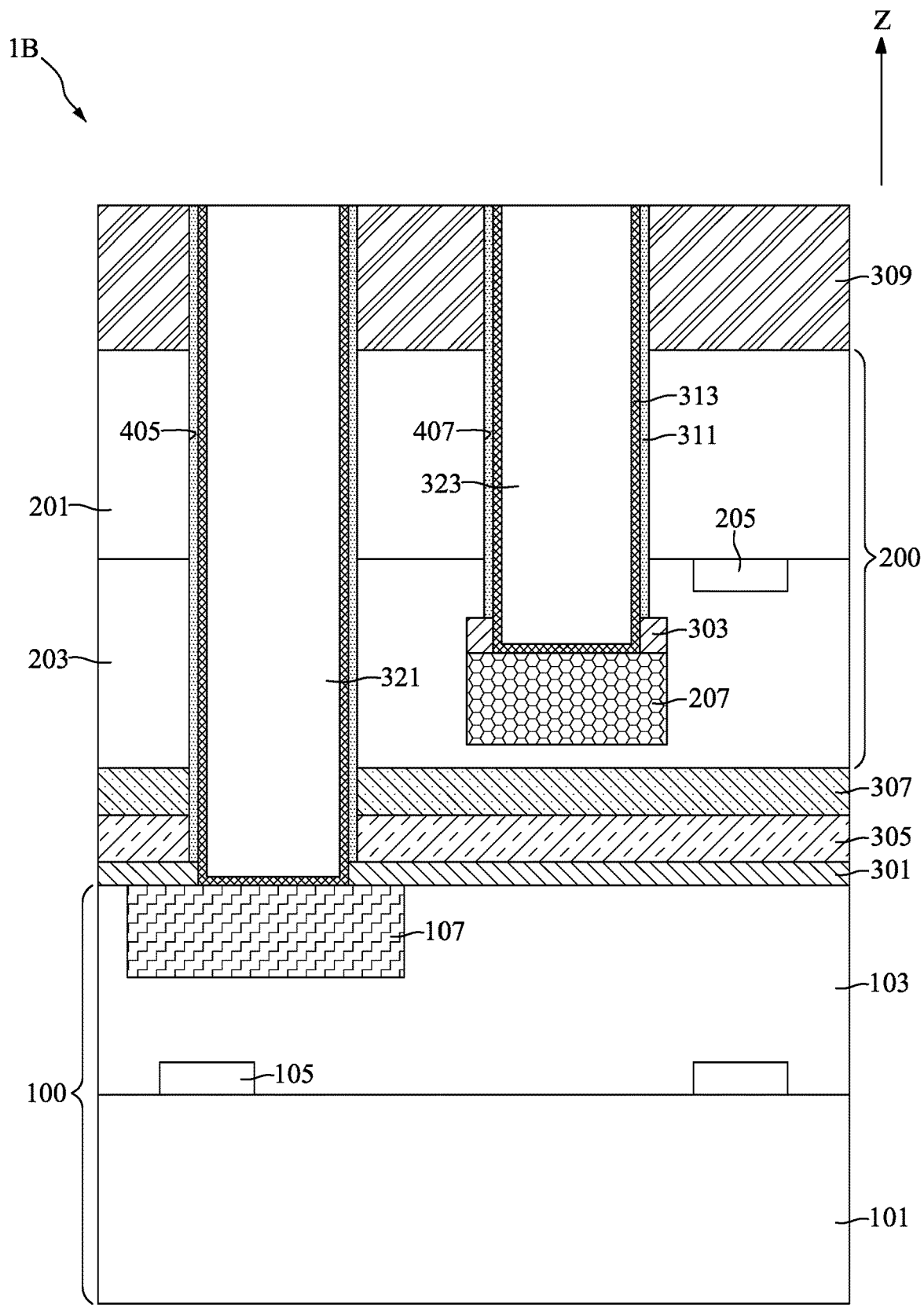

With reference to FIG. 20, the first through substrate via 321 may be formed in the first via opening 405 and the second through substrate via 323 may be formed in the second via opening 407 with a procedure similar to that illustrated in FIGS. 12 to 15. The adhesion layer and the seed layer are not shown for clarity. The first through substrate via 321 and the second through substrate via 323 may be electrically coupled to different external conductive elements and may be controlled separately.

Figure 21:
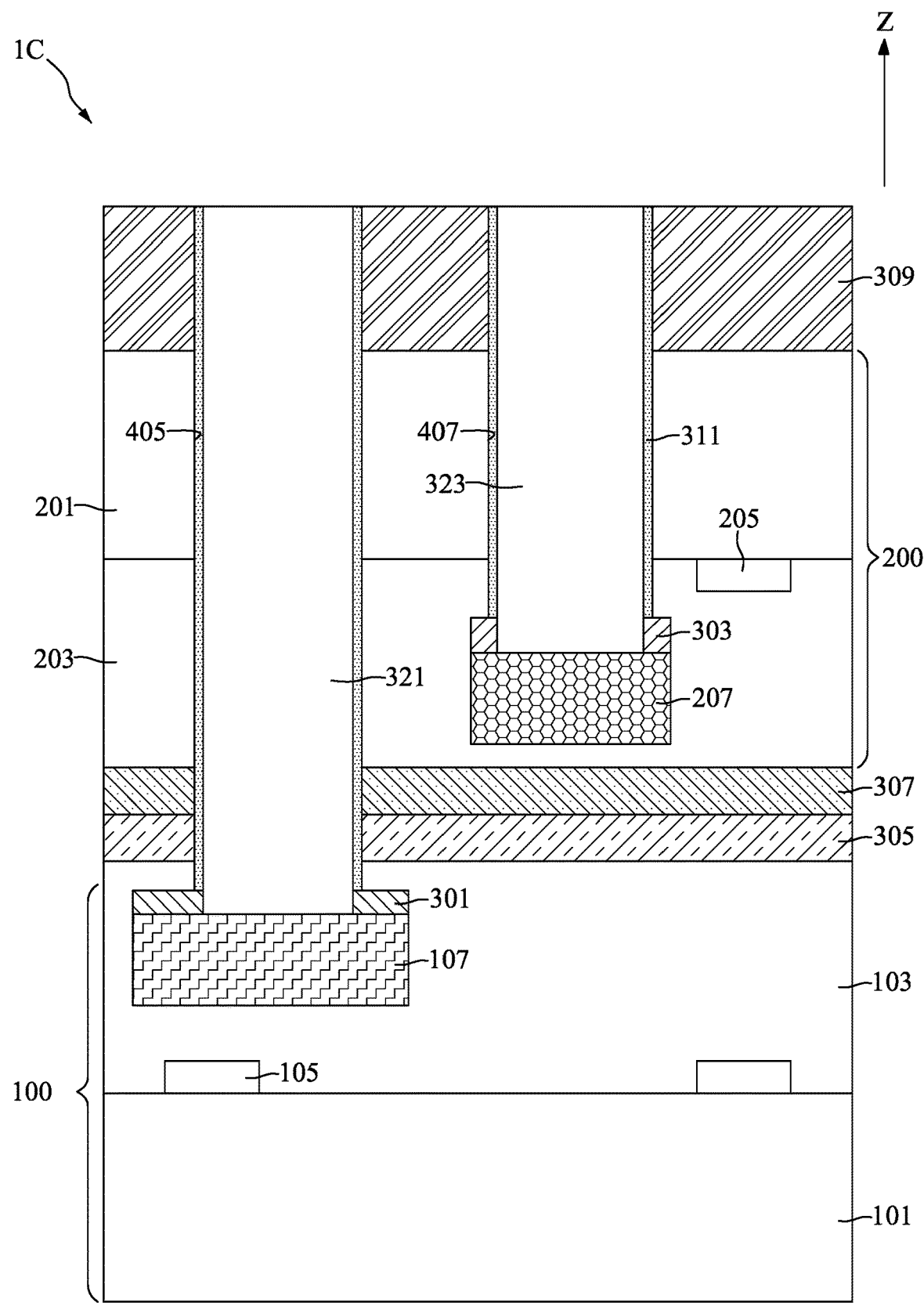
FIG. 21 illustrates, in a schematic cross-sectional view diagram, part of a flow for fabricating a semiconductor device in accordance with another embodiment of the present disclosure.

FIG. 21 illustrates, in a schematic cross-sectional view diagram, part of a flow for fabricating a semiconductor device 1C in accordance with another embodiment of the present disclosure.

With reference to FIG. 21, an intermediate semiconductor device may be fabricating with a procedure similar to that illustrated in FIGS. 16 to 20. The first conductive layer 107 may be formed in the first dielectric layer 103. The top surface of the first conductive layer 107 may be at a vertical level lower than a vertical level of the top surface of the first dielectric layer 103. The first etch stop layer 301 may be formed in the first dielectric layer 103 and on the first conductive layer 107. The first bonding layer 305 may be formed on the first dielectric layer 103. The first conductive layer 107 may be a back end conductive line of the first semiconductor die 100.

Figure 22:
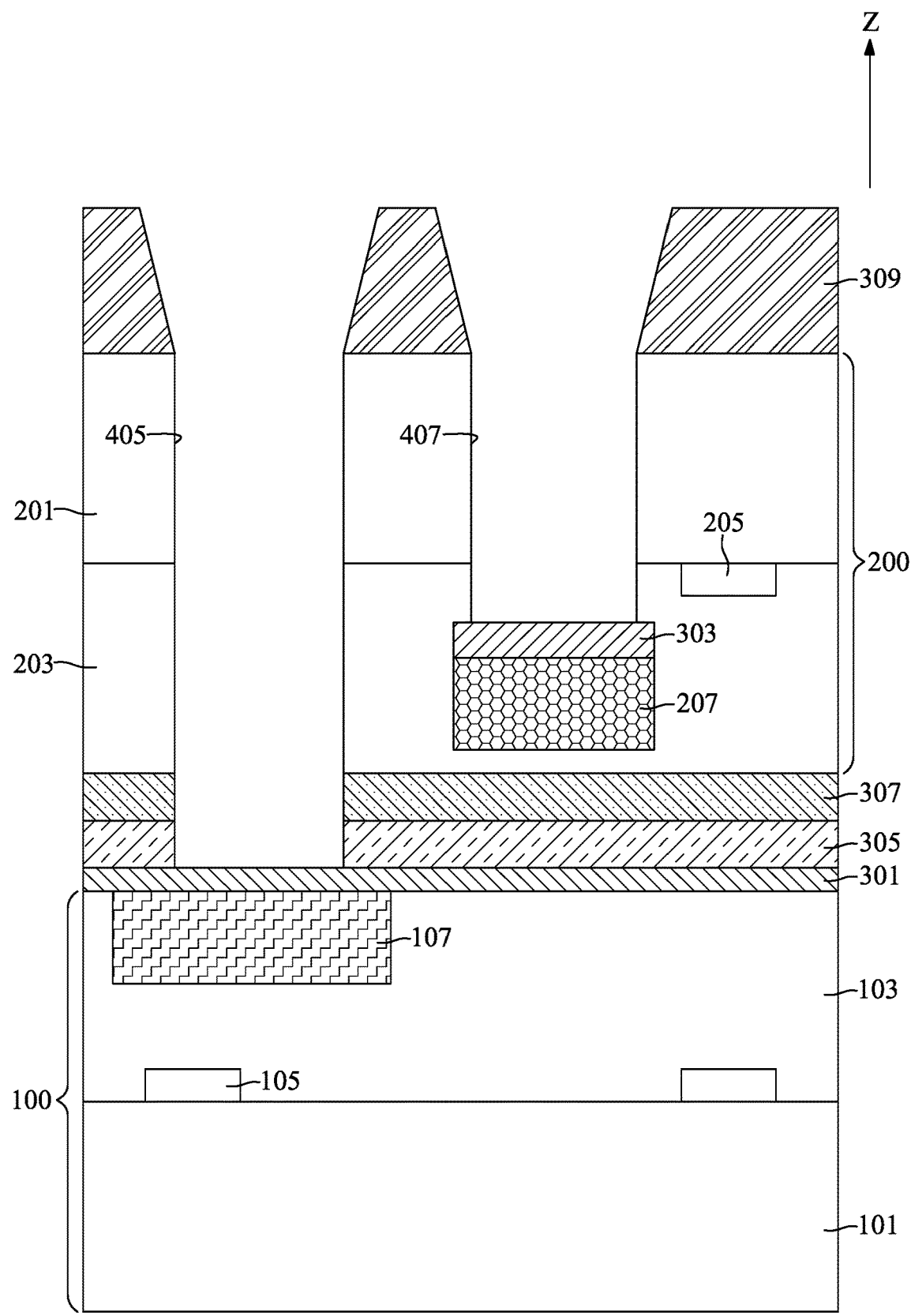
FIGS. 22 to 24 illustrate, in schematic cross-sectional view diagrams, part of a flow for fabricating a semiconductor device in accordance with another embodiment of the present disclosure.
Figure 23:
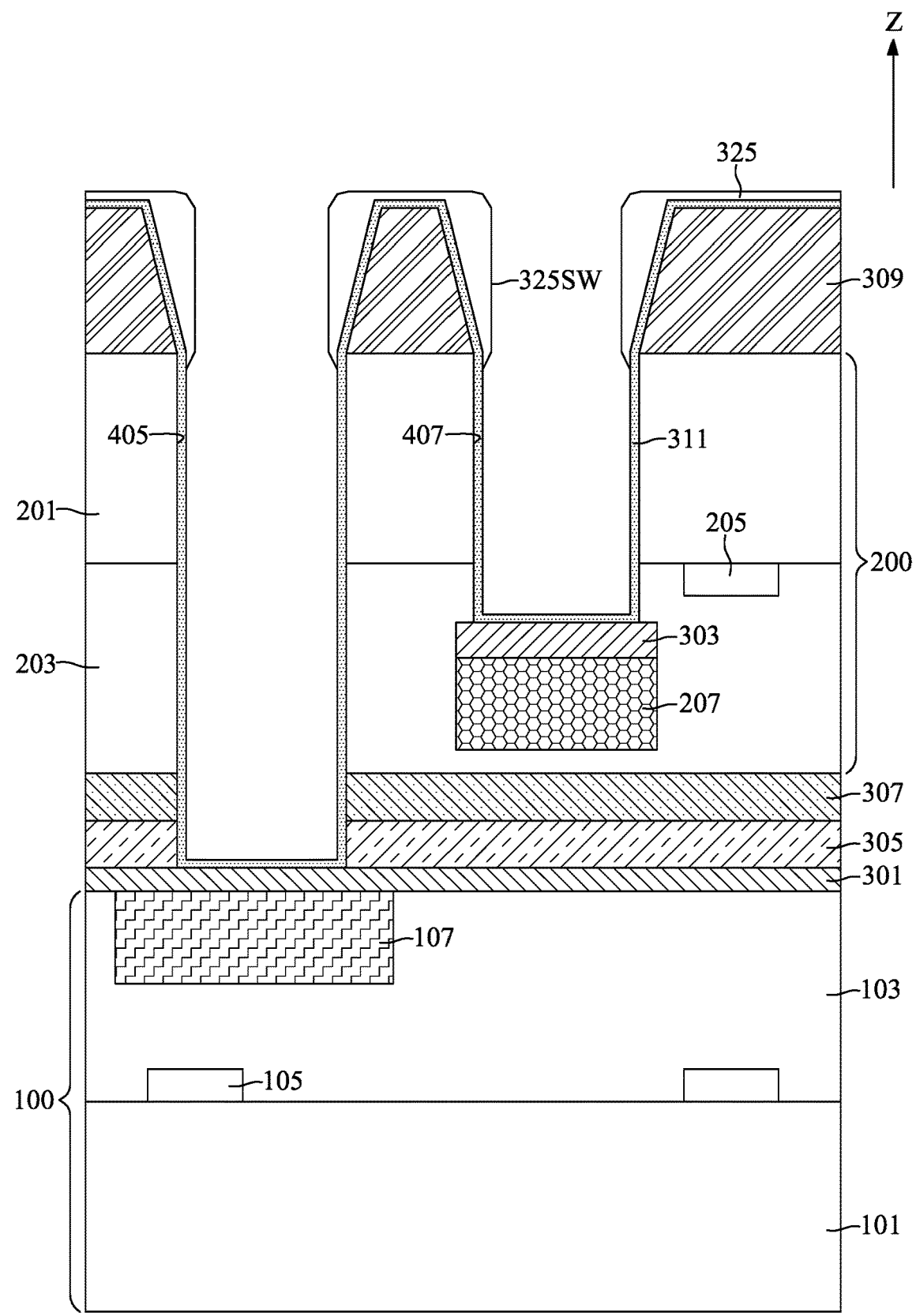
Figure 24:
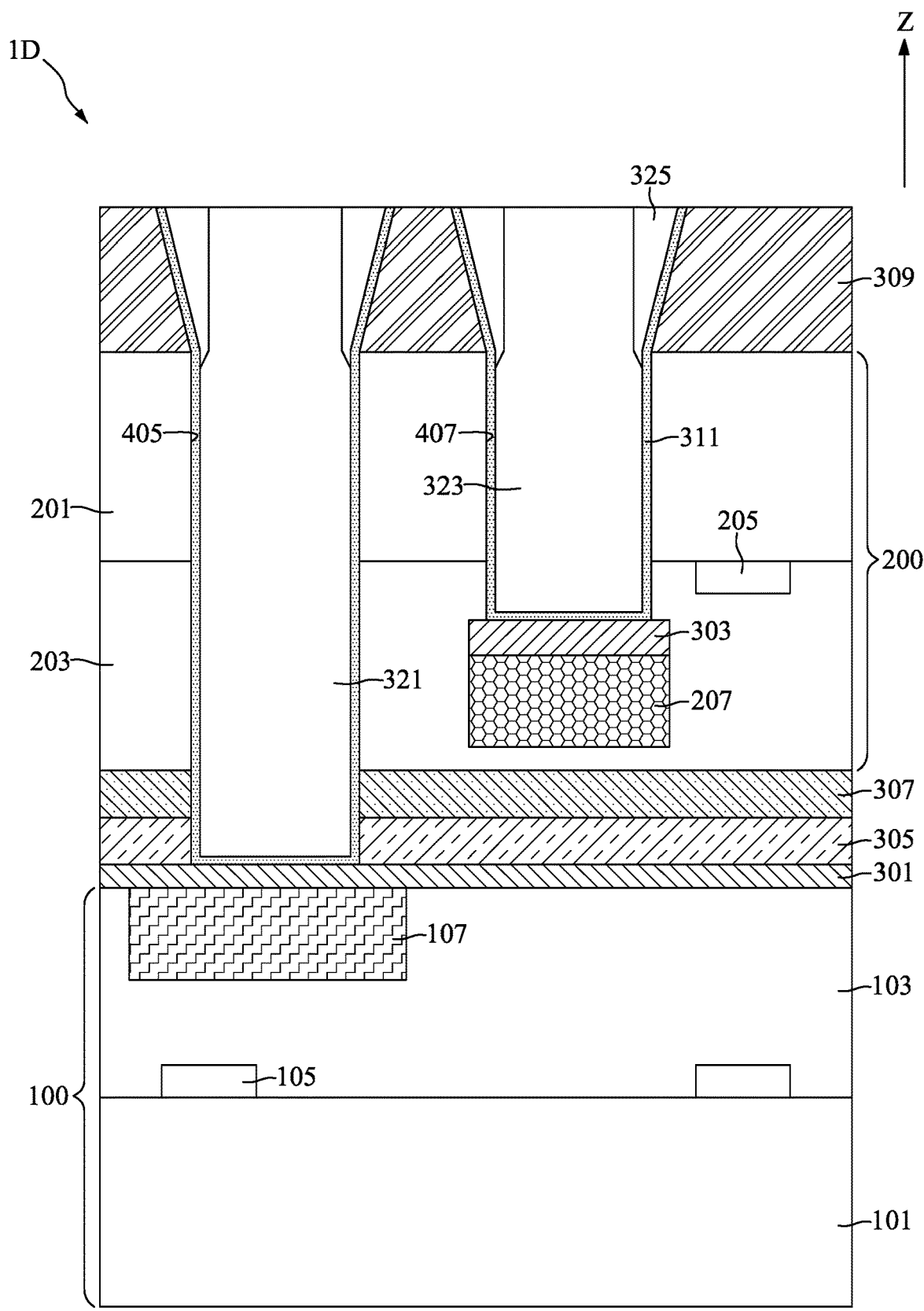

FIGS. 22 to 24 illustrate, in schematic cross-sectional view diagrams, part of a flow for fabricating a semiconductor device 1D in accordance with another embodiment of the present disclosure.

With reference to FIG. 22, an intermediate semiconductor device may be fabricating with a procedure similar to that illustrated in FIG. 16. An expansion etch process may be performed to expand the first via opening 405 and the second via opening 407 in the first passivation layer 309. During the expansion etch process, an etch rate ratio of the first passivation layer 309 to the second substrate 201 may be between about 100:1 and about 1.05:1 or between about 20:1 and about 10:1. In some embodiments, the expansion etch process may be a wet etch process using a wet etch solution. The wet etch solution may be a hydrofluoride solution having 6:1 buffer oxide etchant and including 7% w/w hydrofluoric acid, 34% w/w ammonium fluoride, and 59% w/w water. In some embodiments, the expansion etch process may be a dry etch process using gas selected from the group consisting of $CH_2F_2$, $CHF_3$, and $C_4F_8$.

After the expansion etch process, the widths of the first via opening 405 and the second via opening 407 in the first passivation layer 309 may be broaden and the widths of the first via opening 405 and the second via opening 407 in the second semiconductor die 200 or the first semiconductor die 100 may be unchanged. As a result, the sidewalls of the first via opening 405 and the second via opening 407 in the first passivation layer 309 may be tapered after the expansion etch process. The broaden first via opening 405 and the broaden second via opening 407 in the first passivation layer 309 may gain an improved tolerance window, by providing additional spaces to eliminate the adverse effect originating from the faster deposition rate at the first via opening 405 and the second via opening 407 in the first passivation layer 309, for the formation of void-free filler layers.

With reference to FIG. 23, the isolation layer 311 may be conformally formed in the first via opening 405 and the second via opening 407 with a procedure similar to that illustrated in FIG. 9. The adjustment layers 325 may be formed to cover upper portions of the isolation layer 311. The adjustment layers 325 may be formed by a deposition process such as an atomic layer deposition method precisely controlling an amount of a first precursor of the atomic layer deposition method. The adjustment layers 325 may be formed of, for example, aluminum oxide, hafnium oxide, zirconium oxide, titanium oxide, titanium nitride, tungsten nitride, silicon nitride, or silicon oxide.

In some embodiments, when the adjustment layers 325 are formed of aluminum oxide, the first precursor of the atomic layer deposition method may be trimethylaluminum and a second precursor of the atomic layer deposition method may be water or ozone.

In some embodiments, when the adjustment layers 325 are formed of hafnium oxide, the first precursor of the atomic layer deposition method may be hafnium tetrachloride, hafnium tert-butoxide, hafnium dimethylamide, hafnium ethylmethylamide, hafnium diethylamide, or hafnium methoxy-t-butoxide and the second precursor of the atomic layer deposition method may be water or ozone.

In some embodiments, when the adjustment layers 325 are formed of zirconium oxide, the first precursor of the atomic layer deposition method may be zirconium tetrachloride and the second precursor of the atomic layer deposition method may be water or ozone.

In some embodiments, when the adjustment layers 325 are formed of titanium oxide, the first precursor of the atomic layer deposition method may be titanium tetrachloride, tetraethyl titanate, or titanium isopropoxide and the second precursor of the atomic layer deposition method may be water or ozone.

In some embodiments, when the adjustment layers 325 are formed of titanium nitride, the first precursor of the atomic layer deposition method may be titanium tetrachloride and ammonia.

In some embodiments, when the adjustment layers 325 are formed of tungsten nitride, the first precursor of the atomic layer deposition method may be tungsten hexafluoride and ammonia.

In some embodiments, when the adjustment layers 325 are formed of silicon nitride, the first precursor of the atomic layer deposition method may be silylene, chlorine, ammonia, and/or dinitrogen tetrahydride.

In some embodiments, when the adjustment layers 325 are formed of silicon oxide, the first precursor of the atomic layer deposition method may be silicon tetraisocyanate or $CH_3OSi(NCO)_3$ and the second precursor of the atomic layer deposition method may be hydrogen or ozone.

Due to the tapered sidewalls of the first via opening 405 and the second via opening 407 in the first passivation layer 309, the sidewalls 325SW of the adjustment layers 325 may be substantially vertical. The adjustment layers 325 may provide additional protection to the first passivation layer 309 and the second substrate 201 during the subsequent semiconductor processes. Hence, the metal to silicon leakage, which usually occurs at the interface of the first passivation layer 309 and the second substrate 201, while the formation of the first through substrate via 321 and the second through substrate via 323 may be avoided. As a result, the performance/yield of the semiconductor device 1D may be improved.

In addition, due to the presence of the adjustment layers 325, the deposition rate on the sidewalls of the first via opening 405 and the second via opening 407 may be reduced during the formation of the first through substrate via 321 and the first through substrate via 321. Hence, the deposition rate on the sidewalls of the first via opening 405 and the second via opening 407 and the deposition rate on the bottoms of the first via opening 405 and the second via opening 407 may become close to each other. As a result, the first through substrate via 321 and the second via opening 407 may be filled without any void formation. The yield of the semiconductor device 1D may be improved.

It should be noted that, in the description of the present disclosure, a surface (or sidewall) is "vertical" if there exists a vertical plane from which the surface does not deviate by more than three times the root mean square roughness of the surface.

With reference to FIG. 24, the first through substrate via 321 may be formed in the first via opening 405 and the second through substrate via 323 may be formed in the second via opening 407 with a procedure similar to that illustrated in FIGS. 11 to 15. The barrier layer, the adhesion layer, and the seed layer are not shown for clarity.

Figure 25:
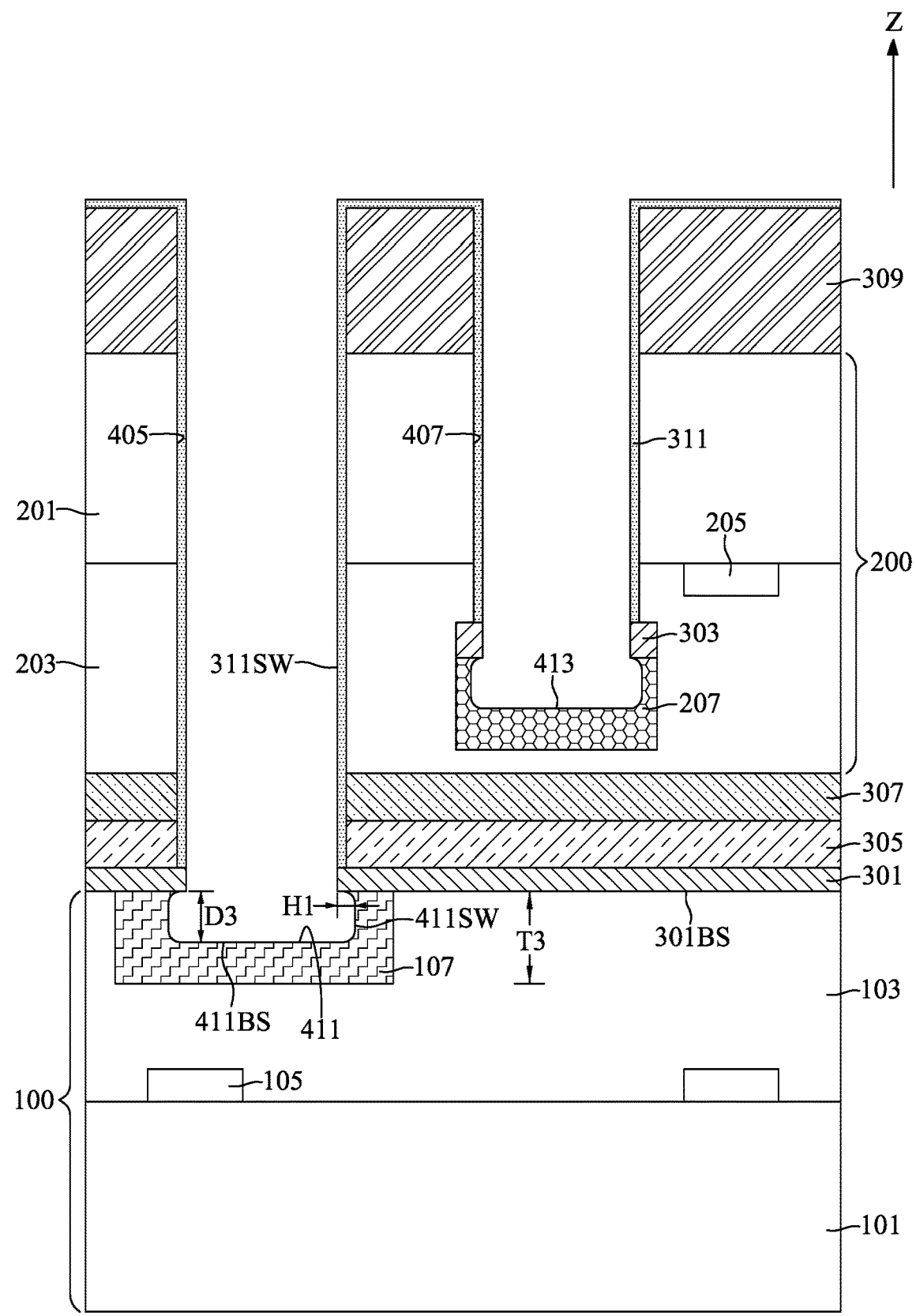
FIGS. 25 to 27 illustrate, in schematic cross-sectional view diagrams, part of a flow for fabricating a semiconductor device in accordance with another embodiment of the present disclosure.
Figure 26:
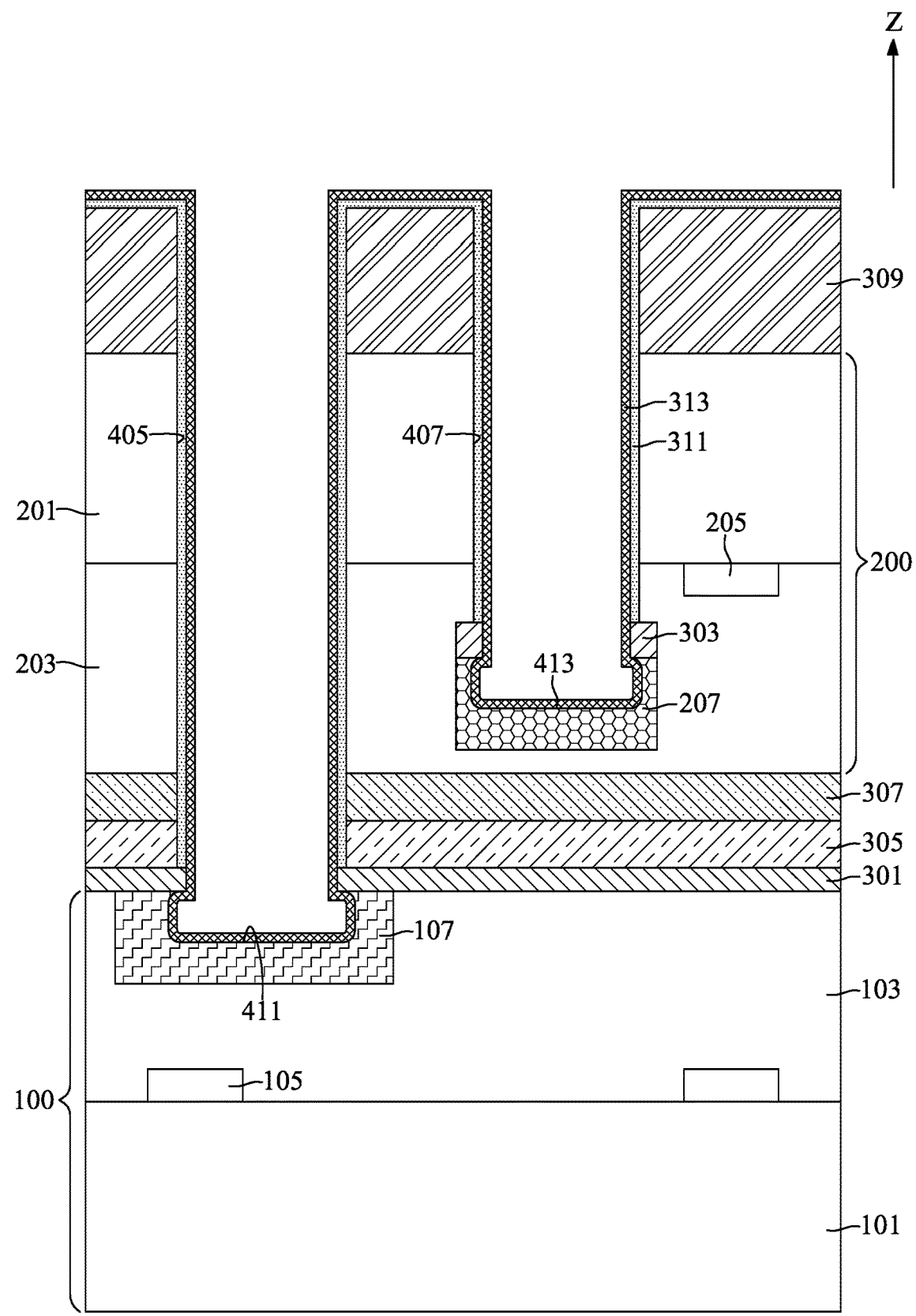
Figure 27:
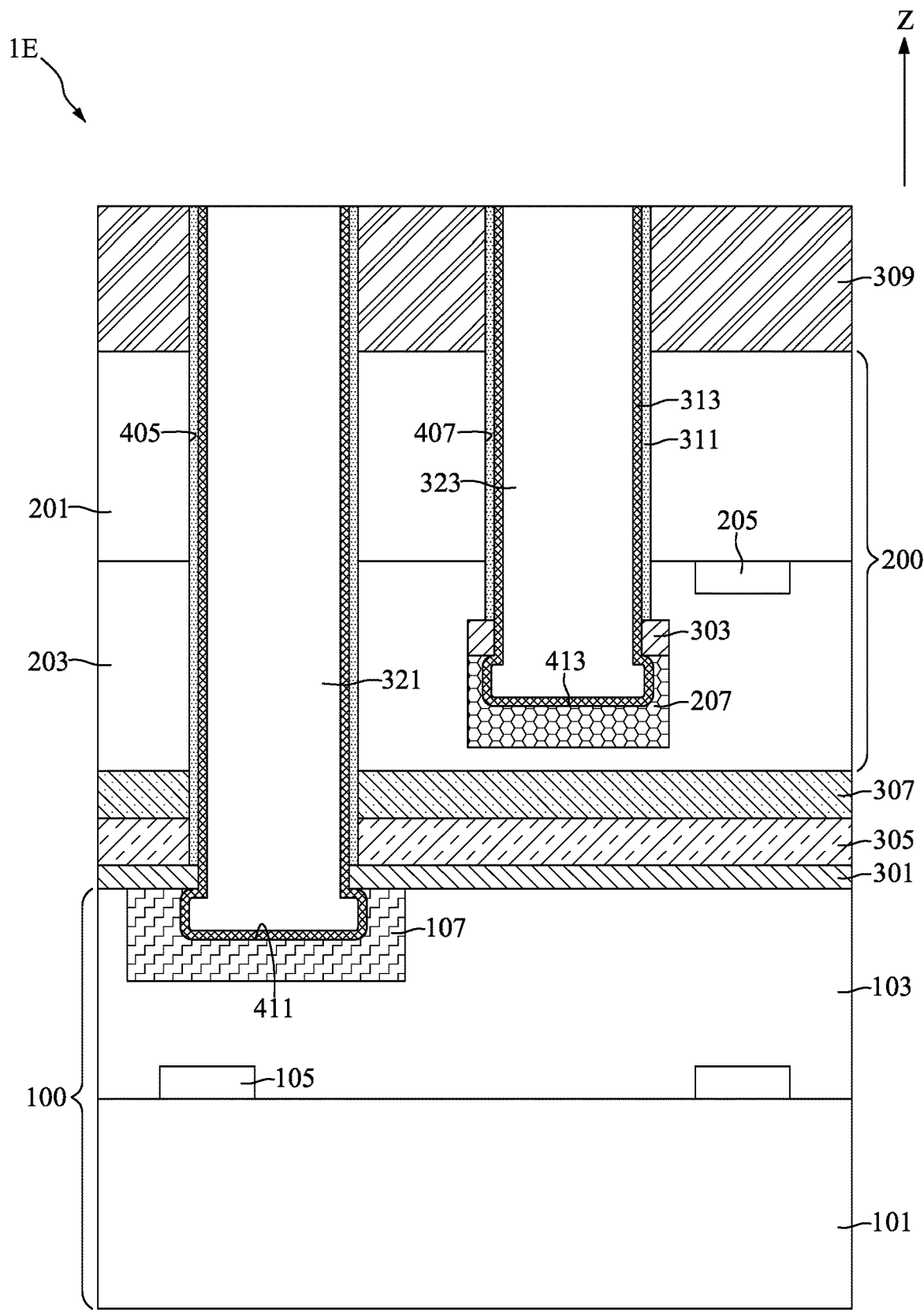

FIGS. 25 to 27 illustrate, in schematic cross-sectional view diagrams, part of a flow for fabricating a semiconductor device 1E in accordance with another embodiment of the present disclosure.

With reference to FIG. 25, an intermediate semiconductor device may be fabricating with a procedure similar to that illustrated in FIG. 18. An isotropic etch process may be performed to form a first recessed space 411 in the first conductive layer 107 and a second recessed space 413 in the second conductive layer 207. In some embodiments, an etch rate ratio of the first conductive layer 107 to the isolation layer 311 may be between about 100:1 and about 1.05:1 or between about 20:1 and about 10:1 during the isotropic etch process. In some embodiments, an etch rate ratio of the second conductive layer 207 to the isolation layer 311 may be between about 100:1 and about 1.05:1 or between about 20:1 and about 10:1 during the isotropic etch process.

With reference to FIG. 25, the first recessed space 411 may be formed downwardly extending from the first via opening 405. A depth D3 of the first recessed space 411, which is the vertical distance between a bottom surface 301BS of the first etch stop layer 301 and a bottom surface 411BS of the first recessed space 411, may be greater than one half of a thickness T3 of the first conductive layer 107 and less than the thickness T3 of the first conductive layer 107. A horizontal distance H1 between the sidewall 311SW of the isolation layer 311 and a sidewall 411SW of the first recessed space 411 may be equal to or less than the depth D3 of the first recessed space 411.

With reference to FIG. 25, in some embodiments, the bottom surface 411BS of the first recessed space 411 and the sidewalls 411SW of the first recessed space 411 may be flat. In some embodiments, the bottom surface 411BS of the first recessed space 411 and the sidewalls 411SW of the first recessed space 411 may be curved. In some embodiments, the intersections of the bottom surface 411BS of the first recessed space 411 and the sidewalls 411SW of the first recessed space 411 may be curved. Corner effects may be avoided if the intersections are curved. The second recessed space 413 may have a shape and dimensions similar to the first recessed space 411.

With reference to FIG. 26, the barrier layer 313 may be conformally formed in the first via opening 405, in the second via opening 407, in the first recessed space 411, and in the second recessed space 413 with a procedure similar to that illustrated in FIG. 19. The barrier layer 313 formed in the first recessed space 411 and the second recessed space 413 may increase the contact surfaces between the barrier layer 313 and the first conductive layer 107 and between the barrier layer 313 and the second conductive layer 207, respectively. Hence, the contact resistance of the barrier layer 313 may be reduced. As a result, the reliability of the semiconductor device 1E may be improved.

With reference to FIG. 27, with a procedure similar to that illustrated in FIG. 20, the first through substrate via 321 may be formed in the first via opening 405 and the first recessed space 411. The second through substrate via 323 may be formed in the second via opening 407 and the second recessed space 413. The adhesion layer, and the seed layer are not shown for clarity.

Due to the design of the semiconductor device of the present disclosure, the greater thickness of the second etch stop layer 303 may compensate the adverse effect of over etching during formation of the via openings. As a result, the yield/reliability of the semiconductor device 1A may be improved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semiconductor device, comprising:
a first semiconductor die comprising a first conductive layer;
a first etch stop layer positioned on the first conductive layer;
a second semiconductor die comprising a second conductive layer positioned above the first etch stop layer;
a second etch stop layer positioned on the second conductive layer;
a first through substrate via positioned along the second semiconductor die and the first etch stop layer, extended to the first semiconductor die, and positioned on the first conductive layer; and
a second through substrate via extended to the second semiconductor die, positioned along the second etch stop layer, and positioned on the second conductive layer;
wherein a thickness of the second etch stop layer is greater than a thickness of the first etch stop layer.

2. The semiconductor device of claim 1, wherein the first etch stop layer and the second etch stop layer are formed of a same material.

3. The semiconductor device of claim 2, wherein a ratio of the thickness of the second etch stop layer to the thickness of the first etch stop layer is between about 1.1 and about 2.0.

4. The semiconductor device of claim 3, wherein a width of the second through substrate via is equal to or greater than a width of the first through substrate via.

5. The semiconductor device of claim 4, further comprising a top conductive layer positioned on the first through substrate via and the second through substrate via.

6. The semiconductor device of claim 5, further comprising isolation layers positioned on sidewalls of the first through substrate via, wherein the isolation layers are formed of silicon oxide, silicon nitride, silicon oxynitride, tetra-ethyl ortho-silicate, or combination thereof.

7. The semiconductor device of claim 5, further comprising an adhesion layer positioned between the first conductive layer and the first through substrate via, wherein the adhesion layer is formed of titanium, tantalum, titanium tungsten, or manganese nitride.

8. The semiconductor device of claim 5, further comprising a seed layer positioned between the first conductive layer and the first through substrate via, wherein the seed layer is formed of copper or ruthenium.

9. The semiconductor device of claim 6, further comprising a first bonding layer positioned on the first etch stop layer and positioned between the first semiconductor die and the second semiconductor die.

10. The semiconductor device of claim 9, wherein an aspect ratio of the second through substrate via is between about between about 1:6 and about 1:15.

11. The semiconductor device of claim 4, wherein the second semiconductor die comprises a second dielectric layer positioned on the first bonding layer and a second substrate positioned on the second dielectric layer, the second conductive layer and the second etch stop layer are positioned in the second dielectric layer, and the second through substrate via is positioned along the second substrate, extended to the second dielectric layer, positioned along the second etch stop layer, and positioned on the second conductive layer.

12. The semiconductor device of claim 11, wherein the second dielectric layer is formed of silicon oxide and the first etch stop layer and the second etch stop layer are formed of silicon nitride, silicon oxynitride, or silicon carbonitride.

13. The semiconductor device of claim 8, wherein the seed layer has a thickness between about 10 nm and about 40 nm.

* * * * *